United States Patent
Tsumura et al.

(10) Patent No.: US 8,008,756 B2
(45) Date of Patent: Aug. 30, 2011

(54) HEAT DISSIPATING WIRING BOARD AND METHOD FOR MANUFACTURING SAME

(75) Inventors: Tetsuya Tsumura, Nara (JP); Hiroharu Nishiyama, Osaka (JP); Etsuo Tsujimoto, Mie (JP)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 12/300,184

(22) PCT Filed: Jun. 13, 2007

(86) PCT No.: PCT/JP2007/061874
§ 371 (c)(1),
(2), (4) Date: Nov. 10, 2008

(87) PCT Pub. No.: WO2007/145237
PCT Pub. Date: Dec. 21, 2007

(65) Prior Publication Data
US 2009/0178828 A1    Jul. 16, 2009

(30) Foreign Application Priority Data

| Jun. 14, 2006 | (JP) | 2006-164297 |
| Jun. 14, 2006 | (JP) | 2006-164298 |
| Sep. 11, 2006 | (JP) | 2006-245207 |
| Sep. 11, 2006 | (JP) | 2006-245208 |
| Sep. 19, 2006 | (JP) | 2006-252066 |
| Sep. 19, 2006 | (JP) | 2006-252067 |

(51) Int. Cl.
*H01L 23/495* (2006.01)

(52) U.S. Cl. ......... 257/667; 257/668; 257/702; 257/706
(58) Field of Classification Search .......... 257/667–668, 257/701–706
See application file for complete search history.

(56) References Cited

U.S. PATENT DOCUMENTS

| 6,060,150 | A |   | 5/2000  | Nakatani et al. |         |
| 6,143,981 | A | * | 11/2000 | Glenn           | 174/534 |
| 6,483,178 | B1| * | 11/2002 | Chuang          | 257/672 |
| 6,863,962 | B2|   | 3/2005  | Nakatani et al. |         |

FOREIGN PATENT DOCUMENTS

JP    01115151 A  *  5/1989
(Continued)

OTHER PUBLICATIONS

International Search Report issued Sep. 18, 2007 in the International (PCT) Application of which the present application is the U.S. National Stage.

*Primary Examiner* — Leonardo Andujar
(74) *Attorney, Agent, or Firm* — Wenderoth, Lind & Ponack, L.L.P.

(57) ABSTRACT

A heat dissipating wiring board includes a metal wiring plate with a circuit pattern formed therein, a filler containing resin layer embedded with the metal wiring plate such that a top surface of the metal wiring plate is exposed, and a heat dissipating plate arranged on an under surface of the filler containing resin layer. The circuit pattern is formed of a through groove provided in the metal wiring plate. The through groove includes a fine groove that opens at the top surface of the metal wiring plate and an expanded groove that expands from a lower end of the fine groove toward the under surface of the metal wiring plate. The heat dissipating wiring board is capable of improving reliability against electric insulation due to dust or the like in a space of the through groove.

13 Claims, 21 Drawing Sheets

FOREIGN PATENT DOCUMENTS

| | | |
|---|---|---|
| JP | 4-364770 | 12/1992 |
| JP | 10-173097 | 6/1998 |
| JP | 2001-210764 | 8/2001 |
| JP | 2003-152148 | 5/2003 |

* cited by examiner

HEAT DISSIPATING WIRING BOARD AND METHOD FOR MANUFACTURING SAME

TECHNICAL FIELD

The present invention relates to a heat dissipating wiring board, which has mounted thereon a pyrogenic element such as an LED element and has a metal wiring plate, a heat conductive resin layer and a heat dissipating plate, and to a manufacturing method thereof.

BACKGROUND ART

FIG. 20A is a perspective view of a conventional heat dissipating wiring board, and FIG. 20B is a sectional view of the same.

As shown in FIGS. 20A and 20B, conventional heat dissipating wiring board 101 has metal wiring plate 103, filler-containing resin layer 104 and heat dissipating plate 105. Metal wiring plate 103 forms a circuit pattern and has through grooves 102. Filler-containing resin layer 104 is embedded with metal wiring plate 103 such that the top surface of metal wiring plate 103 is exposed. Heat dissipating plate 105 is arranged on the under surface of filler-containing resin layer 104. The through grooves 102 are formed by punching of metal wiring plate 103 from the top surface to the under surface by pressing, and have a substantially vertical straight-line shape against the front surface of metal wiring plate 103.

Such heat dissipating wiring board 101 is capable of dissipating heat of an electronic component mounted thereon to heat dissipating plate 105 through filler-containing resin layer 104.

Therefore, also in a case where an electronic component is mounted with high density associated with fine-patternization, it is possible to suppress deterioration in thermal reliability of the electronic component.

It is to be noted that the patent document shown below can be cited as prior art document information concerning the invention of this application.

However, in the foregoing conventional heat dissipating wiring board 101, a space may be generated in through groove 102 that forms a circuit pattern due to incomplete filling with the filler-containing resin. Dust or the like may then get into this space portion, to cause deterioration in reliability against electric insulation.

This is because, since through groove 102 has a straight-line shape almost vertical to metal wiring plate 103, a flow channel of the filler-containing resin sharply narrows from the front surface of metal wiring plate 103 toward the inside of through groove 102, resulting in increased flowing resistance or increased tendency for clogging.

Further, the thinner through groove 102 becomes, or the higher a content of fillers becomes, the more the flowability of the filler-containing resin deteriorates, and the more significant the above-mentioned problem becomes.

Moreover, FIG. 21 is an expanded schematic sectional view of the conventional through hole. As shown in FIG. 21, since through groove 114 for the circuit pattern is formed by pressing, through groove 114 has a straight-line shape almost vertical to the front surface of metal wiring plate 115. Consequently, the flow channel of the filler-containing resin sharply narrows from the front surface of metal wiring plate 115 toward the inside of through groove 114, leading to deterioration in flowability.

Furthermore, the more through groove 114 is narrowed, or the more a content of fillers 122 is increased for improvement in thermal conductivity, or the more fillers 122 having different grain sizes are mixed in order to meet a request for fine-pitching, the more the flowability of the resin containing fillers 122 deteriorates, and the more significant the above-mentioned problem becomes.

[Patent Document 1] Unexamined Japanese Patent Publication No. 2003-152148

SUMMARY OF THE INVENTION

A heat dissipating wiring board comprises: a metal wiring plate with a circuit pattern formed therein: a filler-containing resin layer having embedded therein the metal wiring plate such that a top surface of the metal wiring plate is exposed; and a heat dissipating plate arranged on an under surface of the filler-containing resin layer, wherein a space that divides a part of the circuit pattern is formed of a through groove provided in the metal wiring plate, and the through groove is made up of a fine groove that opens at the top surface of the metal wiring plate; and an expanded groove that expands from a lower end of the fine groove toward an under surface of the metal wiring plate.

A heat dissipating wiring board comprises: a metal wiring plate with a circuit pattern formed therein: a first filler-containing resin layer having embedded therein the metal wiring plate such that a top surface of the metal wiring plate is exposed; and a heat dissipating plate arranged on an under surface of the first filler-containing resin layer, wherein the circuit pattern is formed of a through groove provided in the metal wiring plate, the through groove is made up of: a fine groove that opens at the top surface of the metal wiring plate; and an expanded groove that expands from a lower end of the fine groove toward an under surface of the metal wiring plate; and the fine groove is filled with a second filler-containing resin layer.

A method for manufacturing a heat dissipating wiring board comprises steps of: forming an expanded groove on an under surface of a metal wiring plate; forming a fine groove from a top surface side or an under surface side of the metal wiring plate so as to be superimposed on a part of the expanded groove, thereby to form a through groove; and filling the groove with a resin containing fillers from a bottom of the metal wiring plate.

A method for manufacturing a heat dissipating wiring board comprises steps of: forming an expanded groove on an under surface of a metal wiring plate; filling the inside of the expanded groove with a resin containing first fillers from a bottom of the metal wiring plate; forming a fine groove on a top surface of the metal wiring plate to electrically insulate a part of the metal wiring plate, thereby to form a standalone wiring pattern; and filling the inside of the fine groove with a resin containing second fillers.

REFERENCE MARKS IN THE DRAWINGS

Figure 1:
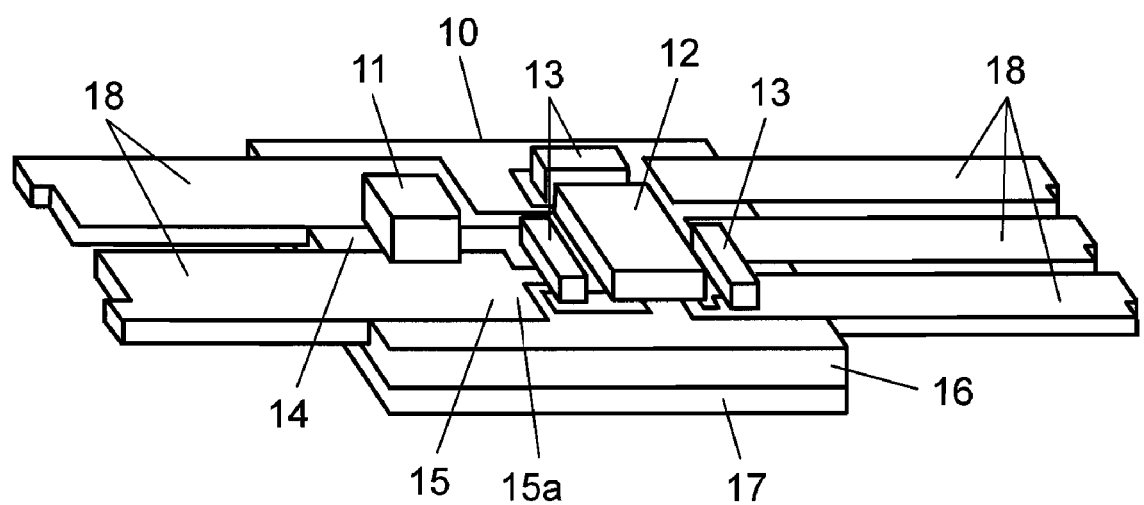
FIG. 1 is a perspective view of a heat dissipating wiring board.

10 Heat dissipating wiring board
11 LED
12 Control IC
13 Chip component
14 Through groove
15 Metal wiring plate
16 Filler containing resin layer
17 Heat dissipating plate
18 Connection terminal
19 Outer frame
20 Fine groove
20a Opening
20b Lower end
21 Expanded groove
22 Filler
23 Film
24 Oxidized film
25 Arrow
26 First filler-containing resin layer
27 Second filler-containing resin layer
28 First filler
29 Second filler
30 Standalone wiring pattern
31 Concave section
32 Convex section
33 Mold
34 Bump

DETAILED DESCRIPTION OF THE INVENTION

The present invention is described below along with Embodiments 1 to 6.

Embodiment 1

In Embodiment 1 described is a case of mounting heat generating components adjacently with high density. Here, the heat generating components are electronic components such as a power semiconductor (a power transistor, a power FET, a CPU, or the like), a micro-transformer, or an LED. With larger size reduction of such an electronic component, the component can contribute more to size reduction of an apparatus. However, with larger size reduction of such an electronic component or with more reduction in mounting form (e.g. package form) of the electronic component (or further, in a case of mounting a bare chip, or the like), the heat generation (or heat dissipation) becomes a more important issue. Therefore, in Embodiment 1, the LED is selected as an example of the heat generating component, and specifically described.

In Embodiment 1 described as an example is heat dissipating wiring board 10 which is a substrate for LED-mounting, and for a large current of 100 A (amperes).

FIG. 1 shows LED 11, control IC 12 and chip component 13 each as an example of heat generating components mounted on heat dissipating wiring board 10 of Embodiment 1. It is to be noted that part of electronic components and wiring patterns are omitted in the drawings. In FIG. 1, through groove 14 is invisible since being hidden by LED 11.

First, a configuration of Embodiment 1 is described.

Figure 2A:
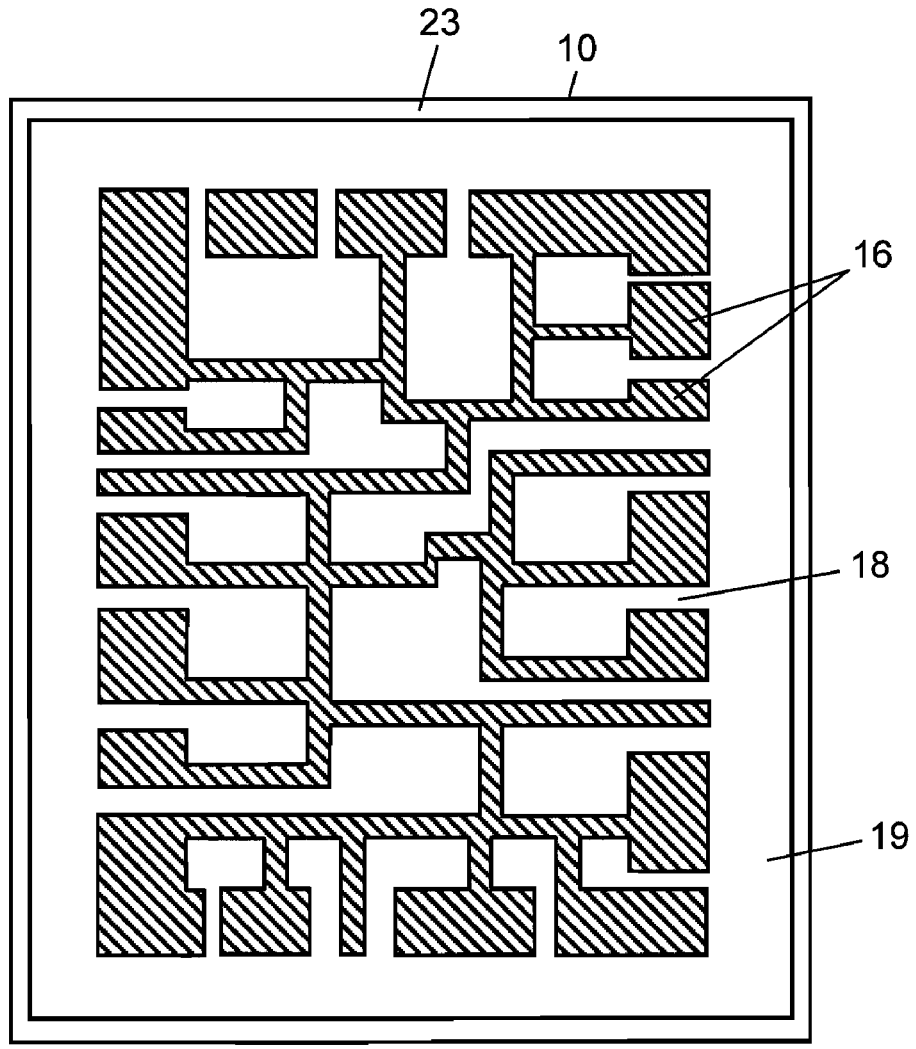
FIG. 2A is a top view of the heat dissipating wiring board.
Figure 2B:
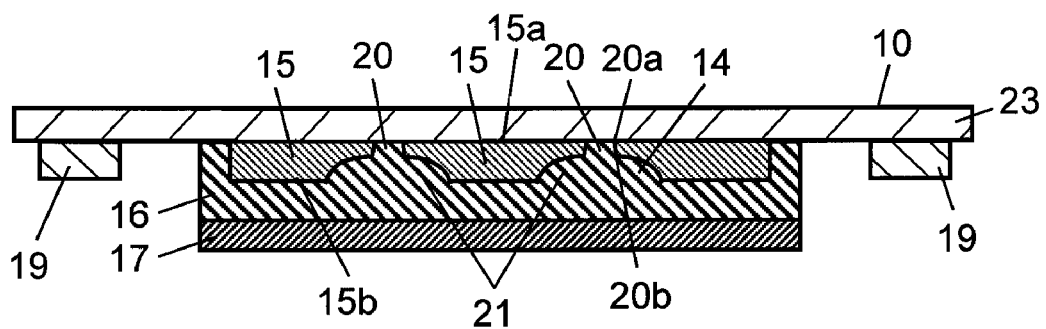
FIG. 2B is a sectional view of the heat dissipating wiring board.

FIG. 2A is a top view of heat dissipating wiring board 10 in Embodiment 1, and FIG. 2B is a sectional view thereof.

As shown in the top view of heat dissipating wiring board 10 in FIG. 2A and the sectional view in FIG. 2B, heat dissipating wiring board 10 has: metal wiring plate 15 with through groove 14 for a circuit pattern formed therein; filler-containing resin layer 16 arranged on the under surface 15b of metal wiring plate 15; and heat dissipating plate 17 arranged on the under surface of this filler-containing resin layer 16. Further, this metal wiring plate 15 is connected with outer frame 19 through connection terminal 18.

The metal wiring plate 15 is embedded in the filler-containing resin layer 16 such that its top surface 15a is exposed, to be integrated with the resin layer 16. Further, through groove 14 for the circuit pattern formed on metal wiring plate 15 is a groove obtained by vertical connection of fine groove 20 and expanded groove 21. As thus described, fine groove 20 and expanded groove 21 are connected with each other inside metal wiring plate 15, to give through groove 14.

Further, an opening of fine groove 20 on the front surface side (or the top surface 15a) of metal wiring plate 15 is defined as opening 20a, and an opening of fine groove 20 on expanded groove 21 side is defined as lower end 20b. Fine groove 20 and expanded groove 21 are connected with each other at lower end 20b of fine groove 20, to form one through groove 14.

It is also desirable to make a maximum groove width of expanded groove 21 (corresponding to a groove width of expanded groove 21 on the under surface 15b of metal wiring plate 15 or a groove width on filler-containing resin layer 16 side) larger than the groove width of fine groove 20 at lower end 20b or opening 20a.

Figure 3:
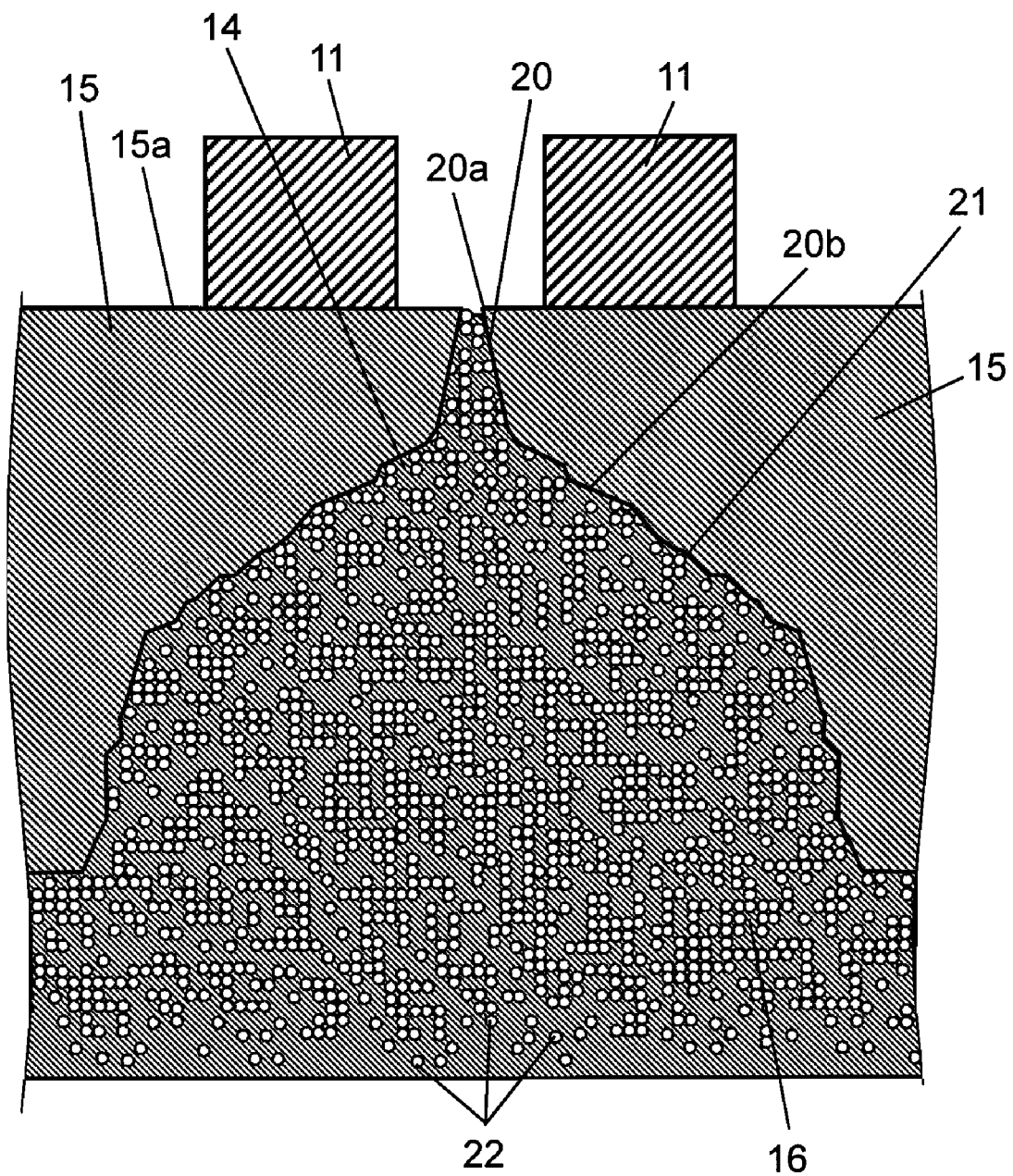
FIG. 3 is an expanded schematic sectional view of the vicinity of a through groove.

FIG. 3 is an expanded schematic sectional view of the vicinity of through groove 14. Fillers 22 are also represented in FIG. 3. Fine groove 20 is formed such that its groove width is gradually expanded from opening 20a (exposed section of metal wiring plate 15 on the top front surface) toward lower end 20b (portion connected with expanded groove 21). The groove width at lower end 20b is larger than the groove width at opening 20a.

Lower end 20b of fine groove 20 does not have a clear border with expanded groove 21, and is smoothly connected therewith. This expanded groove 21 has a configuration where its groove width is gradually expanded from lower end 20b of fine groove 20 toward the under surface 15b of metal wiring plate 15. With no clear border formed, the filling with filler-containing resin layer 16 is facilitated, and a filling quality is thus easy to manage.

Further, an oxidized film (not shown) is provided on each inner wall of fine groove 20 and expanded groove 21, and the oxidized film of fine groove 20 has a smaller film thickness than the oxidized film of expanded groove 21. Moreover, fine groove 20 is formed so as to have a smaller surface roughness (be smoother) than expanded groove 21. With such formation, the filling with filler-containing resin layer 16 is facilitated.

It is to be noted that in Embodiment 1, a substrate made of a copper alloy having a thickness of 0.3 mm is used as metal wiring plate 15. A composition of this metal wiring plate 15 is as follows; metal wiring plate 15 is mainly composed of copper (hereinafter also referred to as Cu), and added with tin (hereinafter also referred to as Sn) in amount of not smaller than 0.1 wt % and smaller than 0.15 wt %, and a total amount of Cu and Sn exceeds 99.96 wt %. Further, a linear expansion coefficient of $8 \times 10^{-6}/°$ C. to $20 \times 10^{-6}/°$ C. is used.

It is to be noted that a thickness of metal wiring plate 15 is desirable not smaller than 0.2 mm and not larger than 0.8 mm. This is because, when the thickness is excessively large, workability in later-described laser processing deteriorates, and when the thickness is excessively small, a large current (in the order of 30 to 150 A) necessary for controlling LED 11 is not allowed to flow.

Cu is used as the main component since it is excellent in thermal conductivity and electric conductivity, and Sn is added since it is capable of raising a softening temperature to about 400° C. When the softening point is high, reliability can be held high at the time of subsequent component mounting (at the time of soldering), or in repetition of heat generation/cooling after mounting of LED 11, and the like.

Examples of an element to be added to Cu may include, other than Sn, zirconium (hereinafter also referred to as Zr), nickel (hereinafter also referred to as Ni), silicone (hereinafter also referred to as Si), zinc (hereinafter also referred to as Zn), phosphorous (hereinafter also referred to as P), iron (hereinafter also referred to as Fe), and chrome (hereinafter also referred to as Cr), and these elements respectively have suitable added amounts. When this added amount is excessively small, the softening temperature of Cu rises to a small degree, and when the added amount is excessively large, an electric characteristic may be affected. From these points of view, it is desirable to set the added amount to not smaller than 0.015 wt % and smaller than 0.15 wt % in the case of Zr, not smaller than 0.1 wt % and smaller than 5 wt % in the case of Ni, not smaller than 0.01 wt % and not larger than 2 wt % in the case of Si, not smaller than 0.1 wt % and smaller than 5 wt % in the case of Zn, not smaller than 0.005 wt % and smaller than 0.1 wt % in the case of P, not smaller than 0.1 wt % and not larger than 5 wt % in the case of Fe, and not smaller than 0.05 wt % and not larger than 1 wt % in the case of Cr. It is to be noted that wt % represents weight percent. Further, either one or some of these elements can be added in the above range of content.

Further, a tensile strength of the copper alloy is desirably not larger than 600 N/mm$^2$. This is because the tensile strength (softness) to this degree is suited to workability. Moreover, an electric conductance is high when the content of Cu is high, and is thus suited to application of a large current, such as LED 11.

It is to be noted that electrolytic tough pitch copper may be selected as metal wiring plate 15. This is because electrolytic tough pitch copper is excellent in electric and thermal conductivity and has favorable spreading properties and drawing workability.

Further, oxygen free copper may be selected as metal wiring plate 15. This is because oxygen free copper has excellent electric and thermal conductivity and good welding properties.

It should be noted that in Embodiment 1, a solder layer (not shown) is previously formed on the top surface 15a of metal wiring plate 15, namely the surface exposed from filler-containing resin layer 16 and having mounted thereon LED 11, control IC 12 and chip component 13. Thereby, soldering properties are improved, to facilitate mounting of the components. Further, rusting of the wiring can be suppressed. In place of this solder layer, a tin layer may be formed. However, it is better not to form the solder layer or the tin layer on the under surface 15b of metal wiring plate 15, namely the surface embedded in filler-containing resin layer 16. This is because such a solder layer or tin layer may become soft in a heating process at the time of soldering or the like, thereby causing reduction in adhesiveness between metal wiring plate 15 and filler-containing resin layer 16.

Moreover, a depth of fine groove 20 is 0.05 mm in Embodiment 1. In view of workability, it is desirable to set the depth to not smaller than 0.03 mm and not larger than 0.15 mm.

It is technically difficult to control the depth of fine groove 20 to smaller than 0.03 mm. Further, when the thickness of fine groove 20 is set to not smaller than 0.15 mm, it is technically difficult to process fine groove 20 with a small groove width.

In Embodiment 1, as shown in FIG. 3, fine groove 20 has a taper configuration where the width at opening 20a is a minimum width of 0.03 mm and the width at lower end 20b is a maximum width of 0.05 mm. It is desirable to set the minimum width of fine groove 20 to not smaller than 0.01 mm and not larger than 0.10 mm, and the maximum width to not smaller than 0.015 mm and not larger than 0.15 mm.

It is to be noted that the taper shape that forms the side surface of fine groove 20 may be a straight-line shape (e.g. mortar shape) or a curved shape (e.g. bell-jar shape or bell shape). Forming fine groove 20 so as to have a cross section in such tapered shape enhances pressed infusion properties of filler-containing resin layer 16.

In addition, it is desirable to set a difference between the width at opening 20a of fine groove 20 and the groove width at lower end 20b of fine groove 20 to not smaller than 5 microns. In the case of this difference in groove width being not larger than 5 microns, fine groove 20 may not function as the taper (including a bell shape, or the like), and may thus affect filling properties of filler-containing resin layer 16.

Further, in Embodiment 1, a maximum width of expanded groove 21 is 0.3 mm. It is desirable to set this maximum width of expanded groove 21 to not smaller than 0.1 mm and not larger than 0.5 mm.

It is to be noted that the maximum width of expanded groove 21 (e.g. the groove width on the under surface 15b side of metal wiring plate 15 or on the opposite side to fine groove 20 in FIG. 3) is larger than the groove width of fine groove 20 at opening 20a. It is desirably larger by not smaller than 0.050 mm for absorbing mutual positional displacement.

Moreover, in the case of comparison between fine groove 20 and expanded groove 21 which form one through groove 14, the maximum width of fine groove 20 (especially the groove width of fine groove 20 at opening 20a) is desirably made smaller than the maximum width of expanded groove 21. This allows absorption of mutual positional displacement (misalignment, dimensional displacement, and the like) in the case of forming expanded groove 21 and fine groove 20 in separate processes so as to be mutually superimposed.

Furthermore, in Embodiment 1, as filler-containing resin layer 16, a resin obtained by filling an epoxy resin with fillers 22 made of $Al_2O_3$ is used. The epoxy resin is used since it is excellent in thermal resistance and electric insulating properties.

As other resins for filler-containing resin layer 16, thermosetting resins such as a phenol resin and a cyanate resin may be used.

Further, a resin filled with, as filler 22, an inorganic filler made of at least any one of MgO, $SiO_2$, BN and AlN, other than $Al_2O_3$, may be used. With the use of fillers 22 made of these inorganic components, the heat dissipating properties can be enhanced. In particular, a linear thermal expansion coefficient can be increased with the use of MgO, and the linear thermal expansion coefficient can be decreased with the use of BN. In such a manner, the thermal expansion coefficient of filler-containing resin layer 16 is adjusted by means of the kind of fillers 22 to be filled, so as to be approximated to thermal expansion coefficients of metal wiring plate 15 and a metal to be used for the circuit pattern, and thereby, thermal reliability of heat dissipating wiring board 10 as a whole can be improved. Further, with the use of $SiO_2$, a dielectric constant can be decreased so that the insulating properties can be improved.

Moreover, the filler 22 made of $Al_2O_3$ used in Embodiment 1 is obtained by mixing $Al_2O_3$ having two kinds of average grain sizes (3 microns and 12 microns). With the use of $Al_2O_3$ having the two kinds of grain sizes (large and small), a space of $Al_2O_3$ having the large grain size can be filled with $Al_2O_3$ having the small grain size, so that $Al_2O_3$ can be filled with a high concentration close to 90 wt %. This results in the thermal conductivity of filler-containing resin layer 16 being in the order of 5 W/mK. It should be noted that fillers 22 shown in FIG. 3 are simplified, to have only one kind of size.

Further, with the use of a material having a high thermal conductivity for the inorganic filler or the epoxy resin, the thermal conductivity of filler-containing resin layer 16 can be in the order of 10 to 20 W/mK.

When fillers 22 having as small a diameter as possible in the range of 0.1 to 100 μm are used and fill with a high concentration in the order of 70 to 95 wt %, the thermal conductivity can be increased. Here, when the filling factor of fillers 22 exceeds 95 wt %, molding becomes difficult, and adhesiveness between filler-containing resin layer 16 and metal wiring plate 15 also decreases.

In addition, when the thickness of filler-containing resin layer 16 is made smaller, it becomes easier to transfer the heat from metal wiring plate 15 to heat dissipating plate 17, but a dielectric voltage decreases. On the other hand, when the thickness is excessively large, the thermal resistance increases, and thereby the thickness may be set to an optimum thickness in consideration of the dielectric voltage and the thermal resistance.

It is to be noted that in Embodiment 1, this filler-containing resin layer 16 made of a thermosetting resin is previously added with a pre-gel member made of thermoplastic resin powders. This pre-gel member absorbs a liquid component of an uncured thermoplastic resin, expands, and quickly gelates, thereby enabling filler-containing resin layer 16 in a half-cured state to be taken out of a mold.

Here, the pre-gel member is a thermoplastic resin such as an acryl resin, a vinyl resin or a polyamide resin, and is desirably obtained by using a resin material which easily dissolves in and has a good compatibility with a liquid thermosetting resin such as an epoxy resin. Further, the pre-gel member is formed into powders for the purpose of increasing absorbability of the liquid component, and each powder desirably has a grain size of 2 to 50 μm, and more desirably in the order of 1 to 10 μm. Further, since filler-containing resin layer 16 having come into the gel state (or half-cured state) is in a state prior to main curing (or prior to thermal curing), even part of filler-containing resin layer 16 adheres to the front surface of the mold or the like as a taint, it can be easily removed, and hence the effect of improving workability is exerted.

This pre-gel member is added to filler-containing resin layer 16 in a ratio of 0.1 to 3.0 wt %. It is desirable to add the pre-gel member to filler-containing resin layer 16 in a ratio of 0.5 to 1.5 wt %. When the pre-gel added ratio is set below 0.1 wt %, the effect of adding the pre-gel member cannot be obtained. On the other hand, when the pre-gel added ratio exceeds 3.0 wt %, molding properties are affected.

Samples in the half-cured state taken out of the mold can be cured in block with separately prepared curing equipment so that the productivity can be enhanced.

Further, in Embodiment 1, a copper substrate having a thickness of 1 mm is used as heat dissipating plate 17. Other than copper, a metal with a good thermal conductivity, such as aluminum, an alloy mainly composed of copper or aluminum, can also be used.

Moreover, forming a fin section (not shown) on the under surface (surface on the opposite side to the surface laminated with filler-containing resin layer 16) of heat dissipating plate 17 with the aim of expanding a surface area can enhance the heat dissipating properties.

Although in FIG. 3, respective LEDs 11, mounted on the front surface of metal wiring plate 15, are mounted to the right and left of one through groove 14, it is also possible, for example, to mount one LED 11 so as to bridge over one through groove 14. Mounting LED 11 on metal wiring plate 15, which is electrically insulated by one through groove 14, so as to bridge over through groove 14 as thus described by bump or wire bonding (neither is shown) enables efficient dissipation of a heat generated in LED 11. This is because the heat generated in LED 11 can be dissipated not only in the thickness direction of metal wiring plate 15 but also in the flat surface direction of metal wiring plate 15. This is also called a flat heat spread effect.

Next, an example of a manufacturing method using a laser is described.

In the following, a method for manufacturing heat dissipating wiring board 10 in Embodiment 1 is described.

First, the under surface 15b side of metal wiring plate 15 shown in FIG. 2B is irradiated with a YAG laser or a $CO_2$ laser as a first laser, to form expanded groove 21.

Next, the deepest section of this expanded groove 21 is irradiated with a green laser using YAG having a wave length of 1.06 μm and a pulse width of 30 ns as a second laser, to form fine groove 20 and make the groove pass through to the top surface 15a of metal wiring plate 15.

It is to be noted that in Embodiment 1, for reducing a spot diameter of the second laser, this green laser (e.g. wave length: 532 nm) is emitted from an optical fiber, to realize fine processing. As this second laser used may be a laser having a wave length of not larger than 600 nm, or further, the green laser or a laser having a shorter wave length.

Moreover, since this second laser has a very short pulse width, the laser irradiation is completed before dispersion of heat generated by the laser irradiation to the vicinity of the laser irradiated portion of a material to be processed, such as metal wiring plate 15. This can make thermal damage, such as thermal deformation of the metal wiring plate 15, less apt to occur. As a result of that, a fine groove with high accuracy can be formed. Additionally, with the wavelength of the second laser being short, the effect of absorbing energy into a metal material (especially copper) constituting the wiring is high so that a temperature of the laser irradiated portion of metal wiring plate 15 can be locally rapidly raised, and an amount of heat dispersion to the vicinity of the laser irradiated portion is small. This can make the thermal damage less apt to occur. As a result of that, a fine groove with high accuracy can be formed. Accordingly, it is possible to suppress a thermal degeneration of the processed surface, so as to form fine through groove 14 with high accuracy in a high aspect ratio.

It is to be noted that, simultaneously with processing of expanded groove 21 and fine groove 20 by the use of the first laser and the second laser, the inner walls of fine groove 20 and expanded groove 21 are oxidized, and insulating oxidized films (not shown) made of oxidized copper can be formed on the front surfaces.

At this time, in the manufacturing method of Embodiment 1, an oxidized film having a smaller film thickness (a thinner oxidized film) can be formed on fine groove 20 than on expanded groove 21.

The reason for this is thought to be that the second laser to form fine groove 20 has a shorter wavelength and a smaller pulse width than the first laser to form expanded groove 21.

Figure 4:
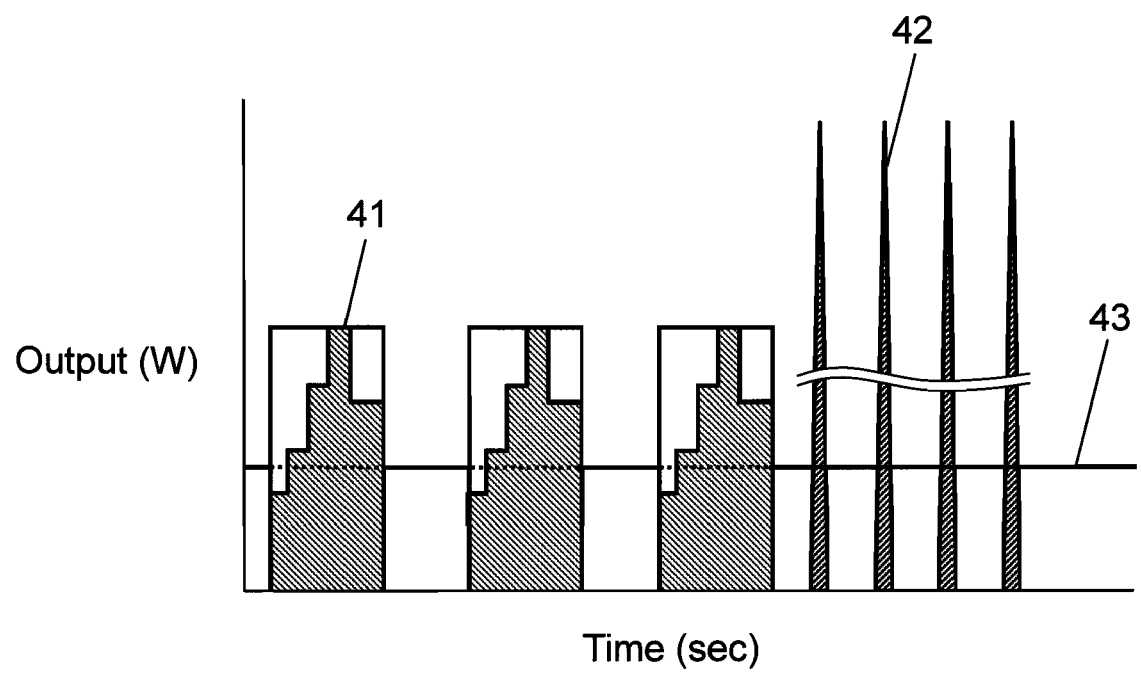
FIG. 4 is a view showing the relationship between the pulse width and the output of a laser.

Next, the lasers are further described with reference to FIG. 4. FIG. 4 is a view showing the relationship between the pulse width and the output of the laser. An abscissa indicates time (unit: sec), and an ordinate indicates a laser output (unit: W).

It is to be noted that first laser 41 and second laser 42 in FIG. 4 represent envelopes of the respective irradiation lasers. Two kinds of envelopes are shown as first laser 41. Namely, those are a rectangular envelope and a stepped envelope. Although not shown in FIG. 4, the envelope of first laser 41 may be represented in regularly distributed shape.

Namely, it is thought that, as shown in FIG. 4, second laser 42 has larger energy at its peak than first laser 41, and can instantly evaporate the substrate, i.e. metal wiring plate 15, so as to advance processing with the minimum energy and suppress a thermal oxidation reaction.

It should be noted that the shorter the pulse width of second laser 42, the lower its thermal damage can be suppressed. With the laser heating instantly completed, expansion of the thermal damage can be suppressed.

In addition, the oxidized film includes a deformed portion (or a damaged portion) generated due to the laser irradiation, and the generation of such a deformed portion can affect electric resistance and thermal conductivity of metal wiring plate 15. Therefore, actively reducing the thickness of the oxidized film in fine groove 20 can suppress the effect exerted by the oxidized film or the deformed portion upon the electric resistance and the thermal conductivity in the vicinity of fine groove 20.

It is to be noted that in the case of using aluminum or an aluminum alloy for metal wiring plate 15, a front surface layer of fine groove 20 can be made of a metal oxide, such as an aluminum oxide film.

As thus described, after formation of through groove 14, film 23 is attached onto the top surface 15a of metal wiring plate 15, and metal wiring plate 15 is put into a mold.

Next, a lump of the filler-containing resin is formed in round, bell, trapezoidal, columnar, or spherical shape such that its center is projected, and placed on the under surface 15b side of metal wiring plate 15. The insides of expanded groove 21 and fine groove 20 are then filled with this filler-containing resin by heat pressing, vacuum heat pressing, or the like such that no space is made, thereby to form filler-containing resin layer 16.

It should be noted that film 23 is provided for suppressing the filler-containing resin from moving around onto the circuit pattern at the time of this pressing. Further, since the thermal conductivity and insulating properties deteriorate if the air is left at the time of pressing, a large number of holes are previously formed in film 23 for enhancing air permeability. In Embodiment 1, a film obtained by forming a plurality of holes in polypropylene film by a laser is used as film 23, but a film obtained by thinly applying an adhesive on a nonwoven cloth, and the like, can be also used.

Next, heat dissipating plate 17 is arranged on the under surface of foregoing filler-containing resin layer 16, and pressed by a mold.

Thereafter, this heat dissipating wiring board 10 is heated at 200° C. for one minute. By this heating, filler-containing resin layer 16 can be half-cured, and taken out of the mold.

Further, this heat dissipating wiring board 10 is put into an oven at 200° C., and filler-containing resin layer 16 is subjected to main curing, to complete heat dissipating wiring board 10 of Embodiment 1.

It is to be noted that, although the lasers are used in the process of forming fine groove 20 and expanded groove 21 in Embodiment 1, a technique such as punch-pressing may be employed for a portion of a relatively rough pattern having a groove width of not smaller than 0.2 mm.

For example, the relatively rough pattern having a groove width of not smaller than 0.2 mm is formed in metal wiring plate 15, and this portion is molded in block by pressing. Forming through groove 14 having fine groove 20 and expanded groove 21 in a portion in which the fine groove 20 is required can enhance the productivity. As thus described, forming the fine groove in the required portion or locally in metal wiring plate 15 can enhance the productivity of heat dissipating wiring board 10 and realize lower cost.

In Embodiment 1, the filling with the filler-containing resin can be facilitated, to improve reliability against electric insulation due to dust or the like.

The reason for this is described below.

As shown in FIG. 3, fine groove 20 is connected with expanded groove 21 on a smooth surface with no clear border, and formed such that the groove width of fine groove 20 becomes wider from opening 20a toward the under surface 15b of metal wiring plate 15. Therefore, filling of the grooves with the filler-containing resin from the under surface 15b of metal wiring plate 15 can gradually narrow a flow channel of this resin containing fillers 22, thereby leading to favorable flowability. As a result of that, it is possible to fill fine groove 20 with the resin containing fillers 22, leaving no space, so as to improve the reliability against electric insulation due to dust or the like.

Further, at the time of filling with the resin containing fillers 22 by pressing, it is possible to make the remnant of the air (called a void) less apt to be generated on the border between through groove 14 and filler-containing resin layer 16, so as to facilitate transferring of a heat generated in LED 11 or the like from metal wiring plate 15 to filler-containing resin layer 16. Moreover, expanding an adhesive area of filler-containing resin layer 16 and metal wiring plate 15 has the effect of enhancing adhesive force.

This configuration is useful since high-density filling with containing resin layer 16 can be facilitated in the case of narrowing the groove width of fine groove 20 for meeting the recent demand for fine-pitching of a circuit pattern, or also in the case of increasing the content of fillers 22 for improving the thermal conductivity.

It is to be noted that, since the second laser is applied from the bottom of expanded groove 21 at the time of processing fine groove 20, a large amount of energy is absorbed into lower end 20b of fine groove 20. Thereby, the border with expanded groove 21 is smoothed, and further, fine groove 20 can be formed so as to have a larger groove width at lower end 20b than at opening 20a.

Further, since excess energy is not absorbed into opening 20a, opening 20a can be formed to be more smooth than lower end 20b. It is therefore possible to reduce generation of a burr and dross on the top surface 15a of metal wiring plate 15 as the surface of mounting the electronic components such as LED 11.

Moreover, it is possible to process the inner wall of fine groove 20 to be smooth, so as to further improve a filling factor of the resin containing fillers 22 with a high concentration (70 to 95 wt %).

The reason for this is described below.

Namely, at the time of processing fine groove 20, a green laser is employed which uses YAG having a wavelength not larger than half of those of the YAG laser or $CO_2$ laser that forms expanded groove 21. Therefore, reducing the spot diameter allows fine processing with higher accuracy, resulting in a smooth surface shape of the inner wall of fine groove 20.

Further, since the green laser using YAG with a pulse width of 30 ns on the degree of a tenth as large as that of a conventional typical laser is employed as the second laser at the time of forming fine groove 20, the inner wall of fine groove 20 can be made smoother.

This is because, in the case of using the laser having a very short pulse width (pulse width: 30 ns), a thermal dispersion length of metal wiring plate 15 becomes as short as about 5 μm so that thermal deformation can be suppressed. Thereby, fine groove 20 can be processed with high accuracy, and as a result, the inner wall shape of fine groove 20 can be made smoother.

It is to be noted that in Embodiment 1, the inner wall of fine groove 20 is formed so as to have a smaller surface roughness (be smoother) than the inner wall of expanded groove 21.

This is because the inner wall of fine groove 20 which is fine and resistant to entrance of the resin containing fillers 22 is made smoother to reduce the flowing resistance of the resin so as to improve the filling factor of filler-containing resin layer 16.

Increasing the roughness of the inner wall of expanded groove 21 leads to generation of an anchor effect so that the adhesiveness of filler-containing resin layer 16 can be improved. Further, making the inner wall of expanded groove 21 have a rough surface can bring the inner wall into contact with fillers 22 at a plurality of points so that the thermal conductivity can be improved.

Further, in Embodiment 1, expanded groove 21 is once formed, and after reduction in thickness of the metal wiring substrate, fine groove 20 is formed, so that this fine groove 20 can be formed with finer pitch.

Namely, when the substrate is excessively thick, a laser beam does not accurately pass through, and forming a fine groove is thus difficult. However, in Embodiment 1, since expanded groove 21 is once formed, adjusting the depth of expanded groove 21 can reduce the depth of fine groove 20.

For example, when the depth of fine groove 20 can be set to not larger than 0.15 mm, fine groove 20 having the minimum width of 0.03 mm can be easily formed using the manufacturing method in Embodiment 1.

Further, since the thickness of metal wiring plate 15 as a whole can be set to not smaller than 0.3 mm, the thermal conductivity can be improved.

Moreover, forming expanded groove 21 in such a manner can reduce an aspect ratio of fine groove 20 and can also reduce processing time, and thereby, dross (matter generated as a result of cooling and adhering of scattered melts) generated at the time of laser processing can be reduced and the processed surface becomes smoother.

As thus described, making the inner wall of fine groove 20 have a smooth surface with a small amount of dross (taint) leads to favorable flowability of the filler-containing resin, which can result in improvement in reliability and insulating properties. Further, with the aspect ratio of fine groove 20 reduced, filling with the filler-containing resin is facilitated.

It is to be noted that, although the filling factor of fillers 22 is enhanced by the use of fillers 22 having large and small grain sizes, there is a problem with this case in that filling a narrow space with filler 22 having a large grain size is difficult. However, configuring through groove 14 of expanded groove 21 and fine groove 20 facilitates filling of a narrow space even with filler 22 having a large grain size. This can enhance filling properties into a fine space in the case of combining low-priced alumina with high-priced BN or the like.

Further, in Embodiment 1, with the oxidized film formed on the inner walls of fine groove 20 and expanded groove 21, the insulating properties can be improved. Further, since this oxidized film can be formed by the heat generated at the time of laser processing, processing fine groove 20 and expanded groove 21 by lasers as in Embodiment 1 can simultaneously form through groove 14 and the oxidized films on the respective inner walls, thereby leading to excellent productivity.

The oxidized film of fine groove 20 is herein desirably thin. This is aimed at suppressing an effect exerted by cleavage of the oxidized film having large brittleness since opening 20a of fine groove 20 is exposed to the surface of mounting the components. It should be noted that examples of the effect exerted by the cleavage may include that the front surface of metal wiring plate 15 is roughened by the cleavage to cause difficulty in mounting of the electronic components, and that the reliability is impaired due to a residual.

Further, changing the thickness of the oxidized films formed on the inner walls of fine groove 20 and the inner wall of expanded groove 21 can also adjust wettability of filler-containing resin layer 16 with respect to the respective inner walls. In this case, a difference in thickness between the oxidized films formed on the respective inner walls is desirably not smaller than 0.01 microns. In the case of the thickness being smaller than 0.01 micron, a pin hole tends to be generated in the oxidized film, and the effect of forming the oxidized film may not be obtained.

In Embodiment 1, as described above, since the oxidized film of fine groove 20 is made to have a smaller film thickness (made thinner) than the oxidized film of expanded groove 21 by means of the conditions of the wavelength and the pulse width of the laser, the cleavage can be reduced while the insulating properties are ensured, thereby allowing improvement in reliability.

Further, in Embodiment 1, since expanded groove 21 is formed in arched shape, thermal expansion at the time of filling with the filler-containing resin or stress at the time of curing constriction can be effectively dispersed, so that thermal deformation of heat dissipating wiring board 10 can be suppressed.

Embodiment 2

Next, Embodiment 2 is described with reference to FIG. 5. It is to be noted that the same places as those in the drawing used in the description in Embodiment 1 are provided with the same referential numerals.

Embodiment 2 corresponds to a case where, for example, expanded groove 21 is formed by etching, mechanical processing or the like, and fine groove 20 is formed by a laser.

Figure 5:
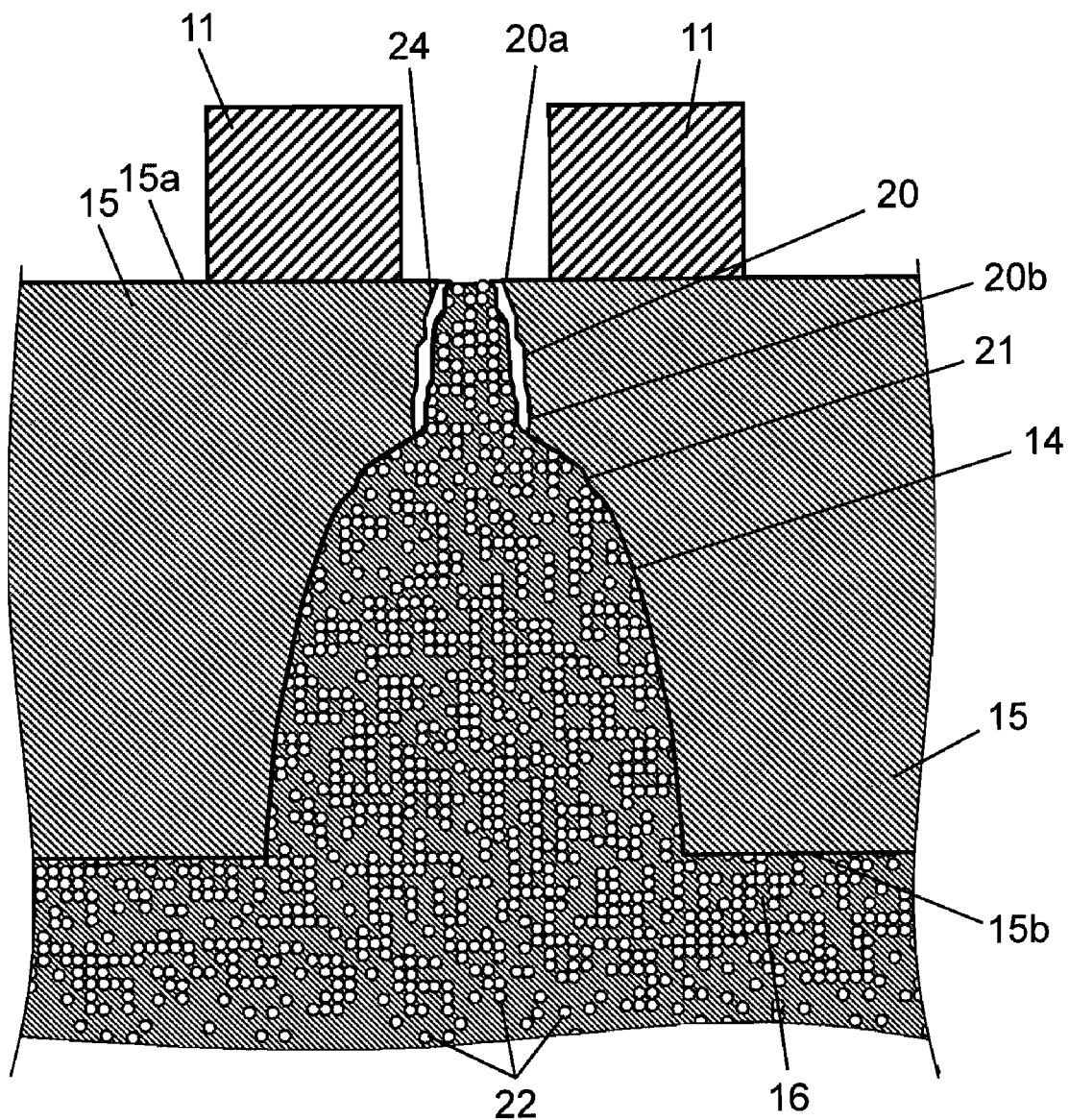
FIG. 5 is a schematic sectional view showing the condition of forming an oxidized film on the front surface of a fine groove.

FIG. 5 is a schematic sectional view showing the condition of forming oxidized film 24 on the surface of fine groove 20. An insulating film herein refers to oxidized film 24 formed on the surface of fine groove 20, and the use of the insulating film in combination can enhance an insulating effect. As oxidized film 24, a metal oxidized film formed by oxidizing the front surface of metal wiring plate 15 can be used.

In FIG. 5, part of through groove 14 is formed of fine groove 20 having opening 20a on the top surface 15a of metal wiring plate 15; and expanded groove 21 that expands from lower end 20b of fine groove 20 toward the under surface 15b of above-mentioned metal wiring plate 15. Further, insulating film 24, having a larger film thickness than that of an oxidized film (not shown) formed on the inner wall of expanded groove 21, is formed on the inner wall of fine groove 20. Moreover, the inner wall of expanded groove 21 is formed so as to have a smaller surface roughness (be smoother) than the inner wall of fine groove 20.

Expanded groove 21 as shown in FIG. 5 can be formed from the rear surface side of metal wiring plate 15 for example by chemical etching or mold pressing. Fine groove 20 is then formed also from the rear surface side of metal wiring plate 15 so as to be superimposed on expanded groove 21, so that through groove 14 is formed. In this manner, formed is a groove having a two-step configuration where its groove width decreases from the bottom toward the top or a groove with large and small grooves mutually superimposed.

Lower end 20b of this fine groove 20 does not have clear border with expanded groove 21, and is smoothly continued thereto. This expanded groove 21 has a configuration where its groove width is gradually expanded from lower end 20b of fine groove 20 toward the under surface 15b of metal wiring plate 15. Further, on the inner wall of fine groove 20, oxidized film 24 is formed which has a larger film thickness than that of the oxidized film (not shown) formed on the inner wall of expanded groove 21. Moreover, the inner wall of expanded groove 21 is formed so as to have a smaller surface roughness (be smoother) than the inner wall of fine groove 20.

As thus described, in forming fine groove 20, it is possible to actively form, by laser processing or the like, oxidized film 24 having a large film thickness on the inner wall of fine groove 20 as compared with the inner wall of expanded groove 21. This is because the processed surface is thermally oxidized by laser processing. With this oxidized film 24, it is possible to further improve the electric insulating properties in fine groove 20. It is to be noted that oxidized film 24 is useful for strengthening the electric insulating properties in fine groove 20 which is so fine as to be difficult to fill with the resin.

Oxidized film 24 of fine groove 20 herein preferably has a homogeneous film thickness. This is because, if the film thickness is heterogeneous, oxidized film 24 with large cleavage is easily cleaved. If the front surface of metal wiring plate 15 is roughed due to this cleavage, mounting the electronic components may become difficult or the reliability may be impaired due to a residual.

It is to be noted that, as shown in FIG. 4, since the laser having a very small pulse is used also in Embodiment 2, the substrate material can be scattered by rapid evaporation, to form the groove prior to dispersion of the heat to the periphery of the substrate. It is thereby possible to suppress thermal deformation of the processed surface, so as to form the homogeneous oxidized film 24.

Further, in Embodiment 2, oxidized film 24 of fine groove 20 is made to have a smaller film thickness (made thinner) than the oxidized film of expanded groove 21 by means of the conditions of the wavelength and the pulse width of the laser, as described in Embodiment 1. Therefore, the cleavage can be reduced while the insulating properties are ensured, thus allowing improvement in reliability.

For example, in the case of using aluminum or an aluminum alloy for metal wiring plate 15, an aluminum oxidized film can be formed as oxidized film 24 on the surface of fine groove 20. This oxidized film 24 can be used as the insulating layer.

Moreover, forming oxidized film 24 can enhance the adhesiveness, such as peeling strength, between metal wiring plate 15 and filler-containing resin layer 16. For example, when the adhesiveness between filler-containing resin layer 16 and metal wiring plate 15 such as copper, aluminum, or a clad alloy of these, is low, actively forming oxidized film 24 can enhance the adhesiveness with the resin.

Especially in the case of forming expanded groove 21 by etching or mechanical processing, the mutual adhesive strength between metal wiring plate 15 and filler-containing resin layer 16 may decrease depending upon the combination thereof. In such a case, for example, forming oxidized film 24 on the front surface of fine groove 20 as shown in FIG. 5 can enhance the adhesiveness with filler-containing resin layer 16.

Further, in the case of using copper for metal wiring plate 15, the adhesiveness with filler-containing resin layer 16 may be affected. In such a case, oxidized film 24 shown in FIG. 5 may be used not as oxidized film 24 but as a layer having a large surface roughness, a layer with a roughed surface, or an adhesiveness improved layer. For example in the case of forming fine groove 20 by a laser having a short wavelength, the surface roughness of its processed surface tends to be small as described above, but adjusting a laser irradiation pulse or a laser feed rate, for example high-speed processing, can actively form concave-convex portions in the processed surface or the cut surface. The concave-convex surface thus formed can be formed as an border portion between fine groove 20 and filler-containing resin layer 16 in place of oxidized film 24. With the use of this concave-convex surface (this may be used in combination with oxidized film 24) as a kind of anchor layer, the adhesive strength between fine groove 20 and filler-containing resin layer 16 can be enhanced.

Embodiment 3

Next, Embodiment 3 is described with reference to FIGS. 6 to 9.

Figure 6:
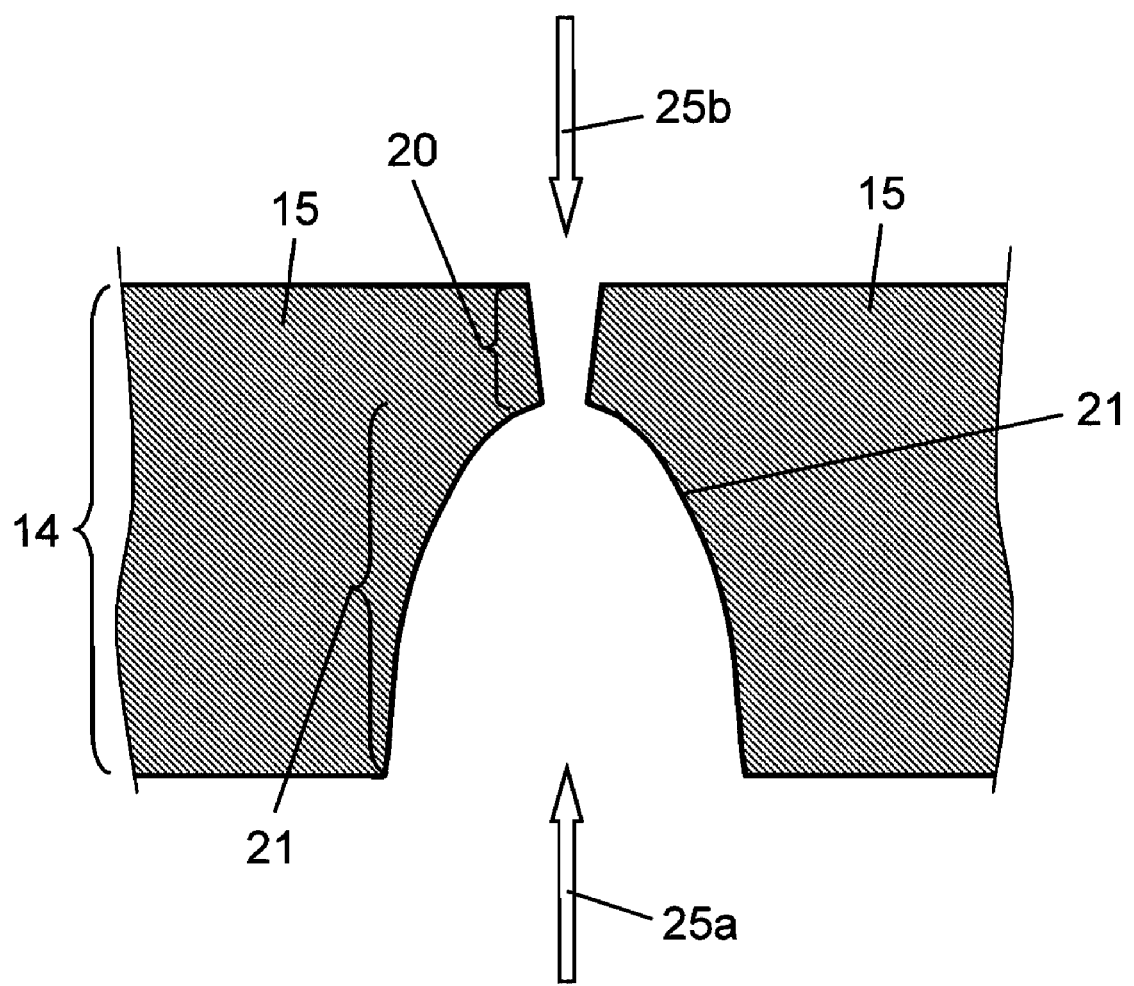
FIG. 6 is a schematic sectional view explaining the condition of performing groove processing from both sides of a metal wiring plate, to form a through groove.

FIG. 6 is a schematic sectional view explaining the condition of performing groove processing from both sides of metal wiring plate 15, to form through groove 14. It is to be noted that the same places as those in the drawing used in descriptions in Embodiments 1 to 2 are provided with the same referential numerals.

First, a copper plate, an aluminum plate or a laminated plate thereof (or a clad plate) is prepared. It is to be noted that a plate obtained by punching a necessary portion by pressing may be used. This plate is used as metal wiring plate 15.

Next, as shown in FIG. 6, expanded groove 21 is formed by etching or laser processing from the rear surface side of metal wiring plate 15 as indicated with arrow 25a. Next, fine groove 20 is formed by etching or laser processing from the front surface side of metal wiring plate 15, so as to be superimposed on expanded groove 21, as indicated with arrow 25b, so that through groove 14 is formed. Forming the grooves from both sides of metal wiring plate 15 thus described can enhance the productivity. It should be noted that in the case of laser processing, it is desirable to form fine groove 20 after formation of expanded groove 21. Thereby, dross (taint) which may be generated at the time of forming expanded groove 21 does not affect fine groove 20.

Further, in the case of forming through groove 14 by etching, simultaneously forming fine groove 20 and expanded groove 21 can suppress etching cost. In this case, the maximum width of expanded groove 21 (groove width on heat dissipating plate 17 side) is previously made larger than the maximum width of fine groove 20, namely the groove width at opening 20a in FIG. 8 so that positional displacement of a mask pattern for etching can be absorbed, thereby to improve a product yield.

Next, the condition of producing a heat dissipating board is described with reference to FIGS. 7 and 8. It is to be noted that the same places as those in the drawing used in descriptions in Embodiments 1 to 2 are provided with the same referential numerals.

Figure 7:
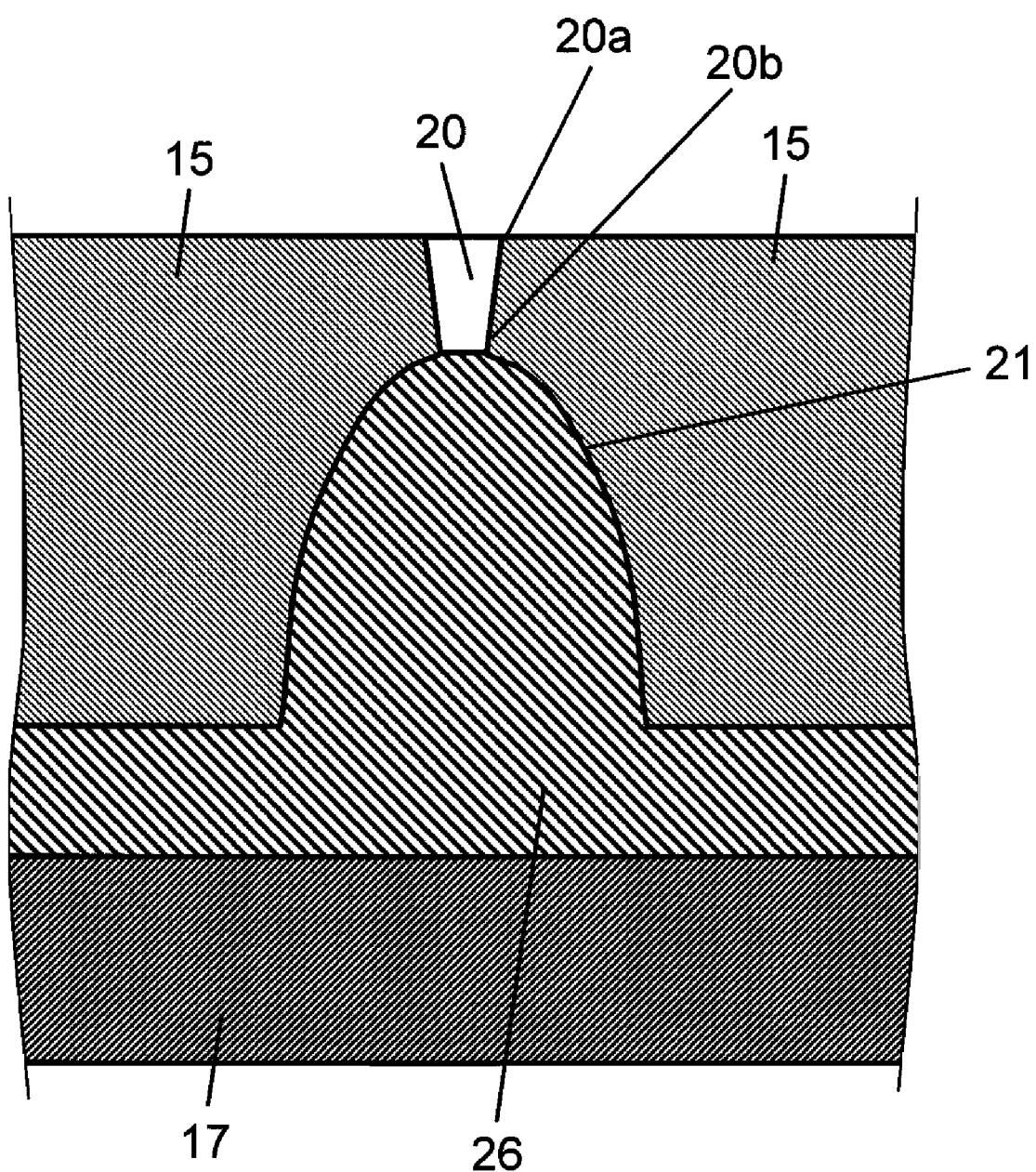
FIG. 7 is a schematic sectional view showing a mid-flow of producing the heat dissipating wiring board.

FIG. 7 is a schematic sectional view showing a mid-flow of producing heat dissipating wiring board 10. As shown in FIG. 7, heat dissipating plate 17 is fixed to the rear surface side of metal wiring plate 15, or the side where the expanded groove 21 has been formed, through first filler-containing resin layer 26. At this time, since the groove width of fine groove 20 is larger at opening 20a than at lower end 20b, it may be difficult to fill the inside of fine groove 20 with first filler-containing resin layer 26.

Figure 8:
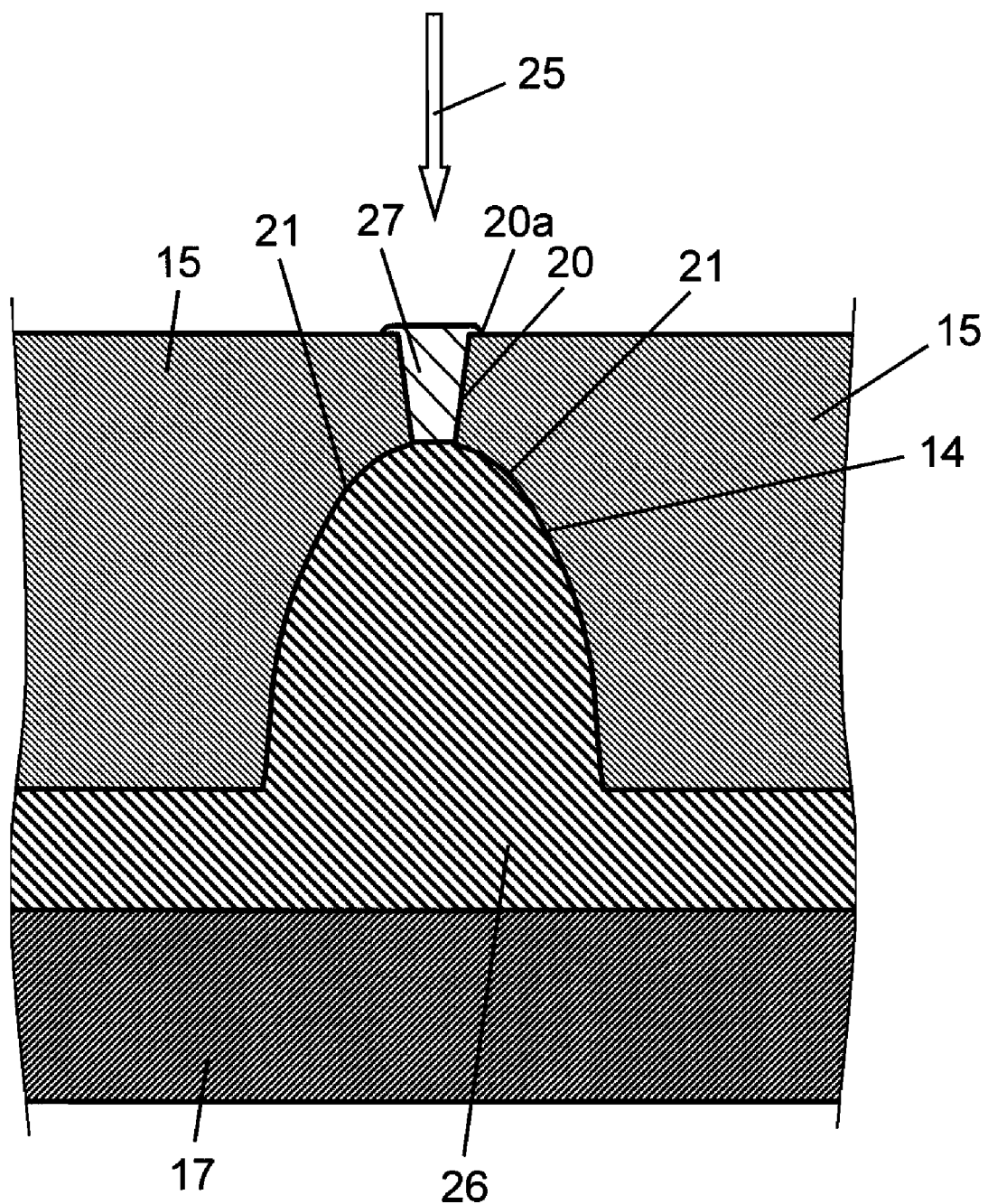
FIG. 8 is a schematic sectional view explaining the condition of filling the fine groove.

In such a case, fine groove 20 can be processed by using second filler-containing resin layer 27 as shown in FIG. 8. FIG. 8 is a schematic sectional view explaining the condition of filling fine groove 20. It should be noted that the same places as those in the drawing used in descriptions in Embodiments 1 to 2 are provided with the same referential numerals.

As indicated with arrow 25 in FIG. 8, fine groove 20 is filled with second filler-containing resin layer 27. At this time, actively making second filler-containing resin layer 27 overflow to the front surface of fine groove 20 or cover opening 20a of fine groove 20 can ensure filling of fine groove 20 with second filler-containing resin layer 27. In addition, devising the pattern of fine groove 20, such as forming a pattern or a hole for air release (though not shown), can also enhance filling properties of second filler-containing resin layer 27. Further, devising a method for filling with second filler-containing resin layer 27, such as imprinting by the use of a rubber plate like squeegee or filling under vacuum, is also effective. At this time, not leaving the air in the inside as bubbles is important.

It is to be noted that first filler-containing resin layer 26 and second filler-containing resin layer 27 may be the same resin layer, such as filler-containing resin layer 16. Alternatively, these may be separate resin layers.

Figure 9:
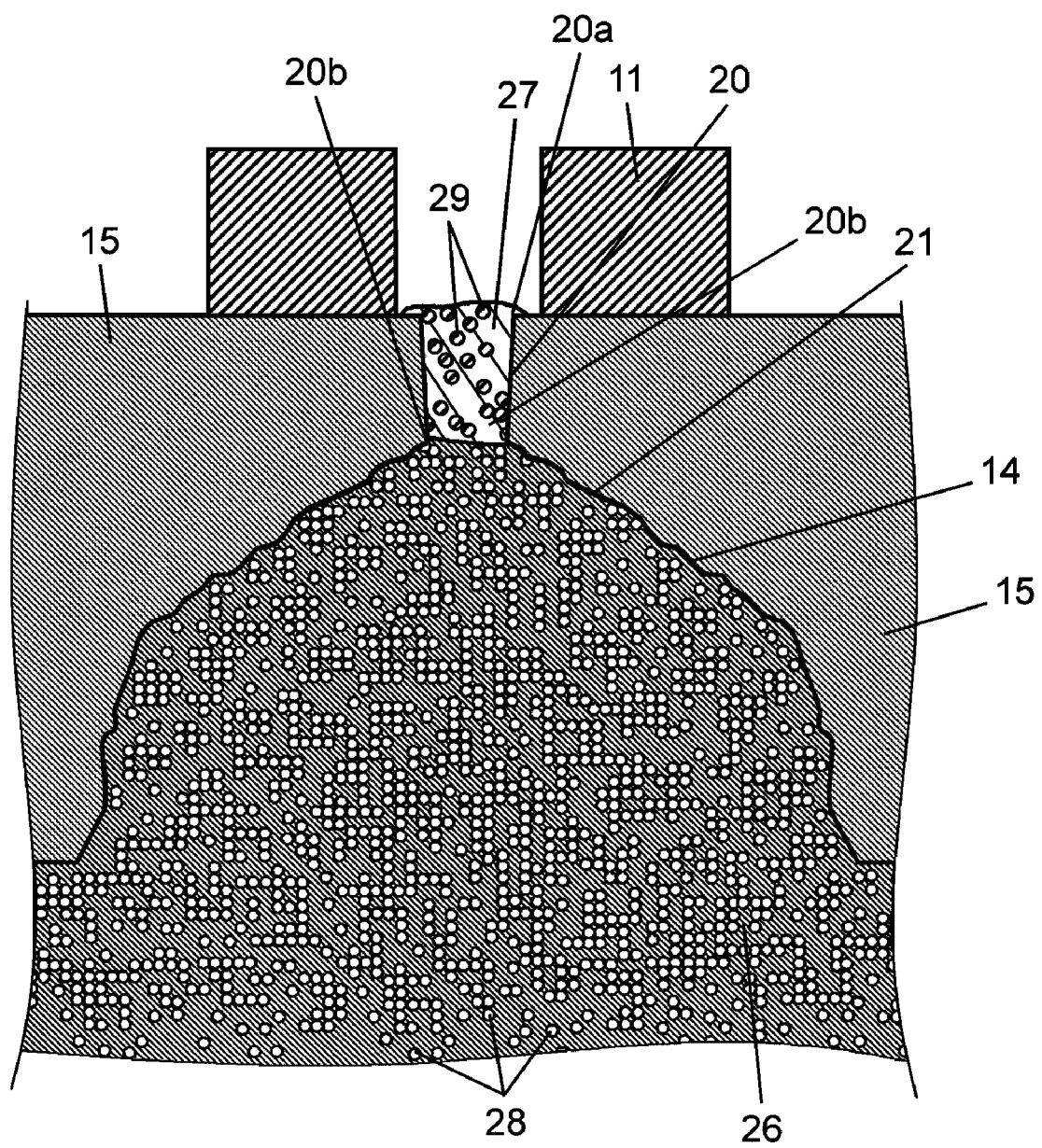
FIG. 9 is a schematic sectional view explaining a condition after mounting a heat generating element.

Next, a further detailed description is given with reference to FIG. 9. FIG. 9 is a schematic sectional view explaining a condition after mounting of LED 11. It should be noted that the same places as those in the drawing used in descriptions in Embodiments 1 to 2 are provided with the same referential numerals. In FIG. 9, through groove 14 is formed of fine groove 20 and expanded groove 21. The inside of expanded groove 21 is filled with first filler-containing resin layer 26 containing first fillers 28, and the inside of fine groove 20 is filled with second filler-containing resin layer 27 containing second fillers 29. Filling through groove 14 with the filler-containing resin from both sides of through groove 14, and further from the wide opening side, enhances its filling properties.

As shown by the sectional view of FIG. 9, with the groove width of opening 20a widened more than that at lower end 20b, a cross-sectional shape of fine groove 20 is a trapezium with a wide top and a narrow bottom. Consequently, metal wiring plate 15 that forms the bottom of fine groove 20 comes into the state of being as close as thrusting out, or protruding in wedge shape, to first filler-containing resin layer 26 side or second filler-containing resin layer 27 side. Part of this partially thrust metal wiring plate, such as lower end 20b, is taken as a kind of an anchor or a wedge, so as to become a structural section for making metal wiring plate 15 physically resistant to peeling from first filler-containing resin layer 26 and second filler-containing resin layer 27. Moreover, with this structure, the effect of increasing an insulating distance or a creeping distance can be also obtained.

It should be noted that as shown in FIG. 9, increasing the surface roughness of expanded groove 21 leads to the effect of enhancing the adhesive strength between metal wiring plate 15 and first filler-containing resin layer 26. For example, forming fine groove 20 and expanded groove 21, shown in FIG. 6, by two kinds of lasers leads such an effect. However, preparing two kinds of lasers may increase cost.

It is possible to cope with such a case by using the same laser or the same wavelength while changing a spot diameter of the laser. Namely, a large spot diameter is used in forming expanded groove 21, and a small spot diameter is used in forming fine groove 20.

In addition, the same effect can be also obtained by changing a driving pulse of the laser or changing a lens system or an optical system, other than by changing the spot diameter of the laser.

Embodiment 4

Next, described as Embodiment 4 with reference to FIGS. 10A to 15 is the case of cutting off part of a pattern of heat dissipating wiring board 10 and using it as a standalone wiring pattern. It should be noted that the same places as those in the drawing used in descriptions in Embodiments 1 to 3 are provided with the same referential numerals.

Figure 10A:
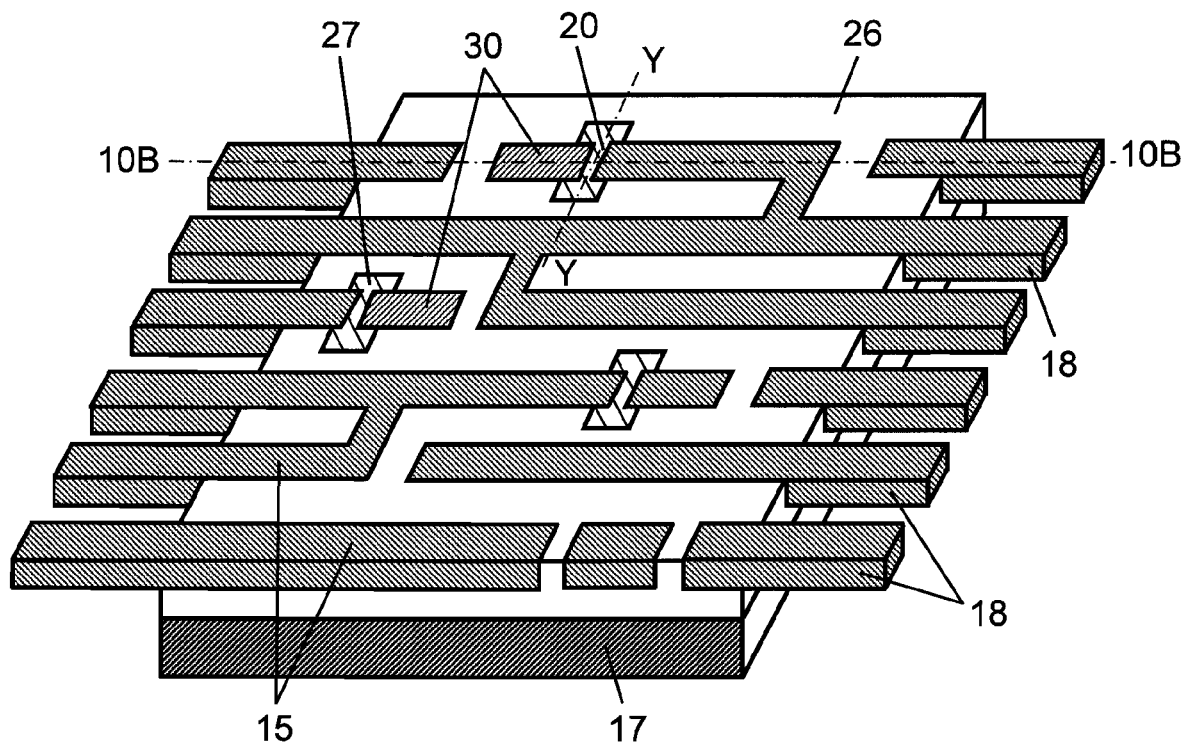
FIG. 10A is a view explaining a heat dissipating wiring board having a standalone wiring pattern in part thereof.
Figure 10B:
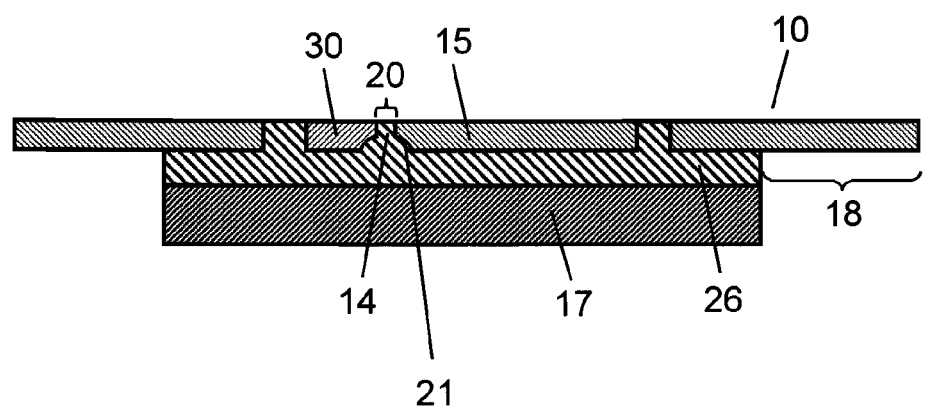
FIG. 10B is a sectional view along 10B-10B.

FIG. 10A is a perspective view explaining heat dissipating wiring board 10 having the standalone wiring pattern on part thereof, and FIG. 10B is a sectional view along 10B-10B.

In FIGS. 10A and 10B, standalone wiring pattern 30 corresponds to a wiring pattern electrically insulated from another metal wiring plate 15. Making part of metal wiring plate 15 have standalone wiring pattern 30 in such a manner can enhance degrees of freedom of pattern design.

For example in the case of heat dissipating wiring board 10 shown in FIG. 2B and the like, outer frame 19, a so-called periphery corresponding to the edge portion, of metal wiring plate 15 is cut off so that metal wiring plate 15 having been connected and integrated by outer frame 19 can be taken apart or mutually electrically insulated. However, in such a case, it is necessary to connect one end of metal wiring plate 15 to outer frame 19 through connection terminal 18.

Standalone wiring pattern 30 described in Embodiment 4 corresponds to a pattern not having connection terminal 18 connected to outer frame 19.

In FIG. 10A, standalone wiring pattern 30 is obtained, for example, such that a pattern integrated with metal wiring plate 15 is cut off along a portion indicated with Y-Y by the use of a laser or the like, and electrically insulated as standalone wiring pattern 30, and the vicinity of this cut-off portion is protected by second filler-containing resin layer 27.

FIG. 10B corresponds to a sectional view along 10B-10B of FIG. 10A. As shown in FIG. 10B, through groove 14 having expanded groove 21 is formed in part of standalone wiring pattern 30. Originally, standalone wiring pattern 30 is part of metal wiring plate 15 and integrated therewith through expanded groove 21 or with expanded groove 21 as a kind of connection bar. Forming fine groove 20 so as to be superimposed on expanded groove 21 makes part of metal wiring plate 15 independent and separated, thereby to form standalone wiring pattern 30.

Next, described with reference to FIGS. 11 to 15 is a method for manufacturing heat dissipating wiring board 10 having standalone wiring pattern 30 on part thereof. It should be noted that the same places as those in the drawing used in descriptions in Embodiments 1 to 3 are provided with the same referential numerals.

Figure 11:
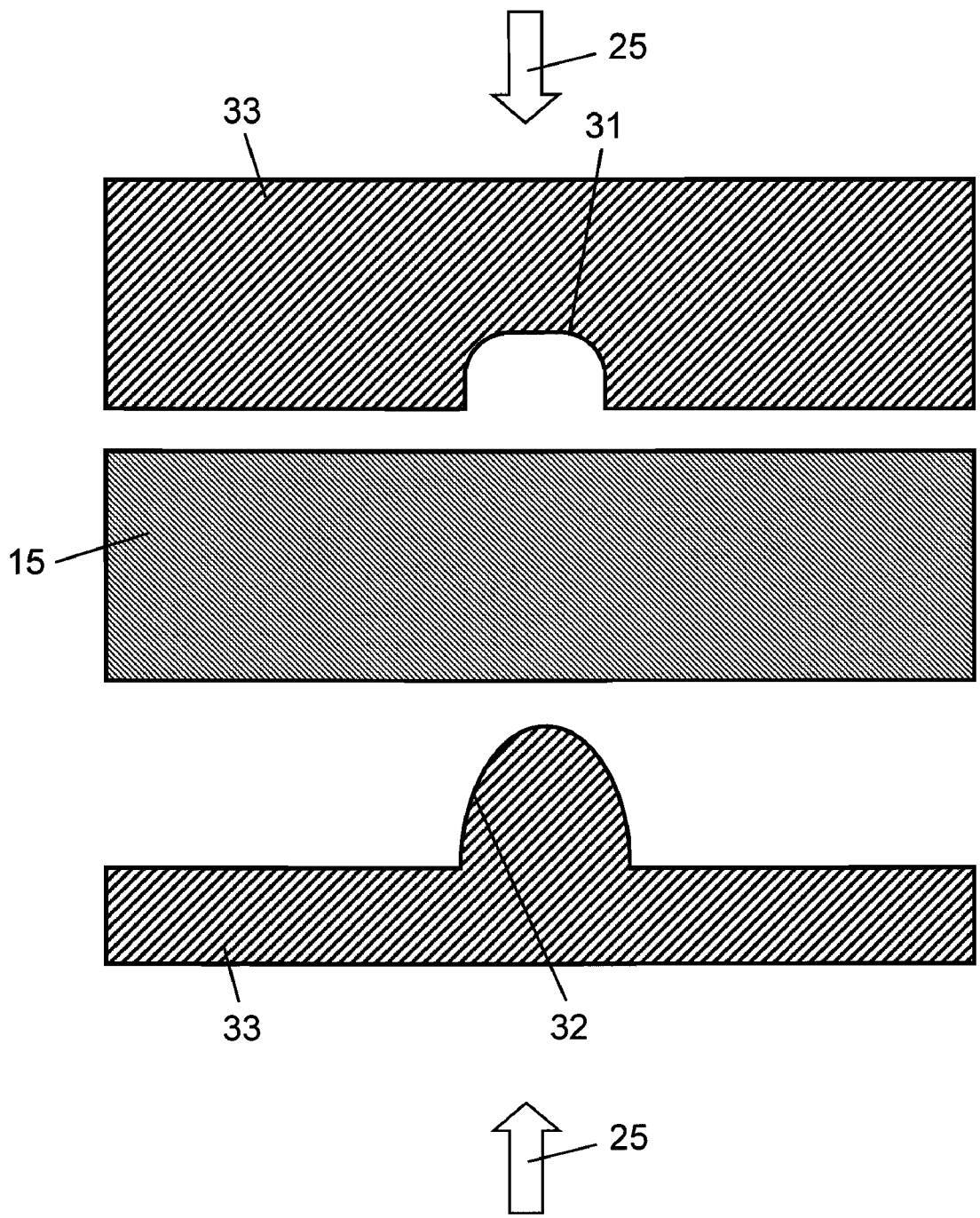
FIG. 11 is a schematic sectional view explaining the condition of forming an expanded groove in part of the metal wiring plate by the use of a mold.

FIG. 11 is a schematic sectional view explaining the condition of forming an expanded groove (not shown) in part of the metal wiring plate 15 by the use of a mold. Mold 33 having concave section 31 and convex section 32 on its front surface is pressed onto metal wiring plate 15 in a direction indicated with arrow 25, to depress part of metal wiring plate 15. It is desirable to use metal wiring plate 15 previously patterned in a prescribed shape by pressing or etching or by a laser. It is to be noted that at the time of depressing metal wiring plate 15, a protruding portion or the like generated on the opposite side thereto is removed by grinding or the like. This allows enhancement of workability in metal wiring plate 15. In such a manner, metal wiring plate 15 having expanded groove 21 on part thereof, as shown in FIG. 12, is prepared.

Figure 12:
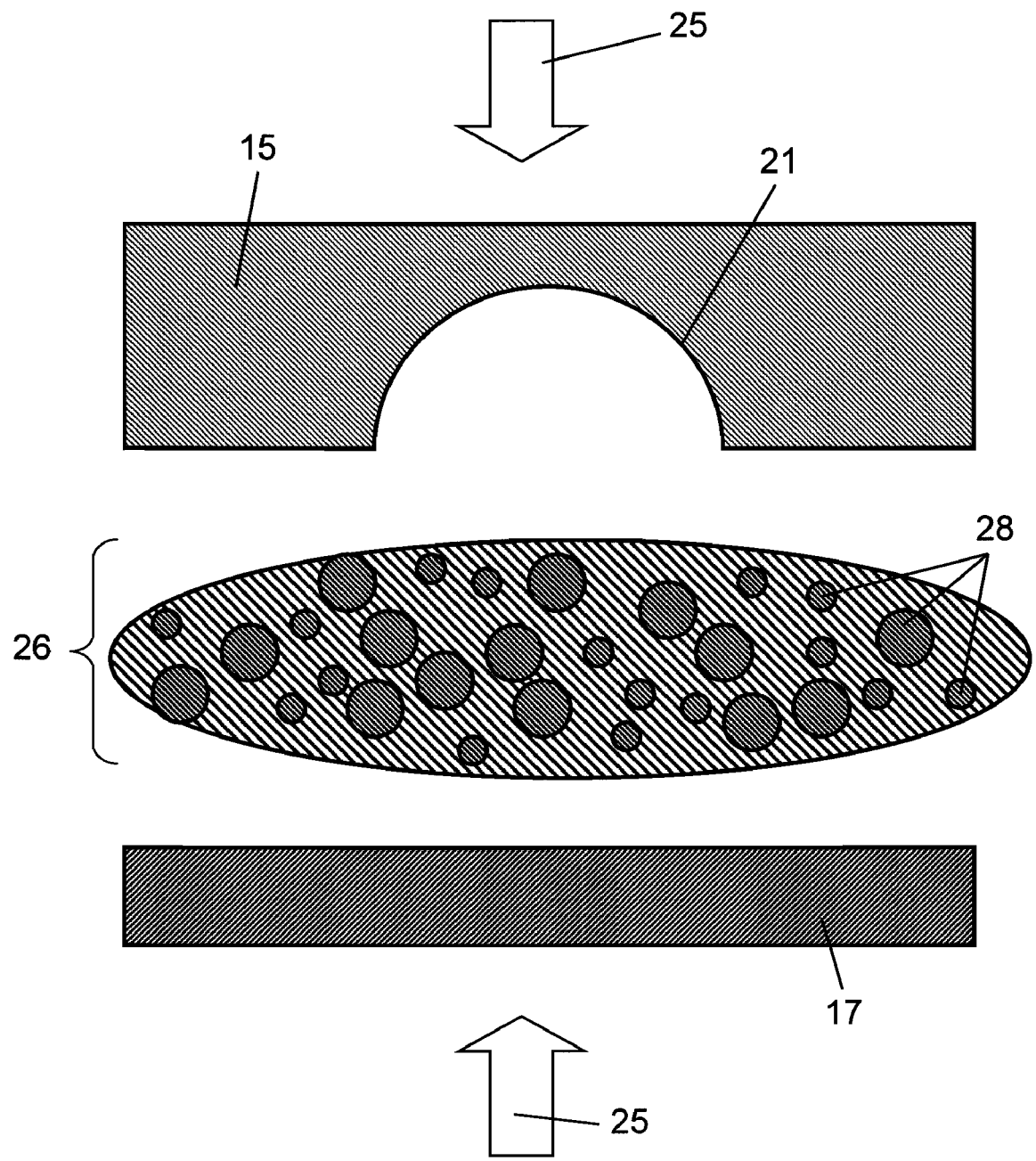
FIG. 12 is a schematic sectional view explaining the condition of integrating a wiring plate having the expanded groove with a heat dissipating plate by the use of a first filler-containing resin layer.

FIG. 12 is a schematic sectional view explaining the condition of integrating metal wiring plate 15 having expanded groove 21 with heat dissipating plate 17 by the use of first filler-containing resin layer 26.

Figure 13:
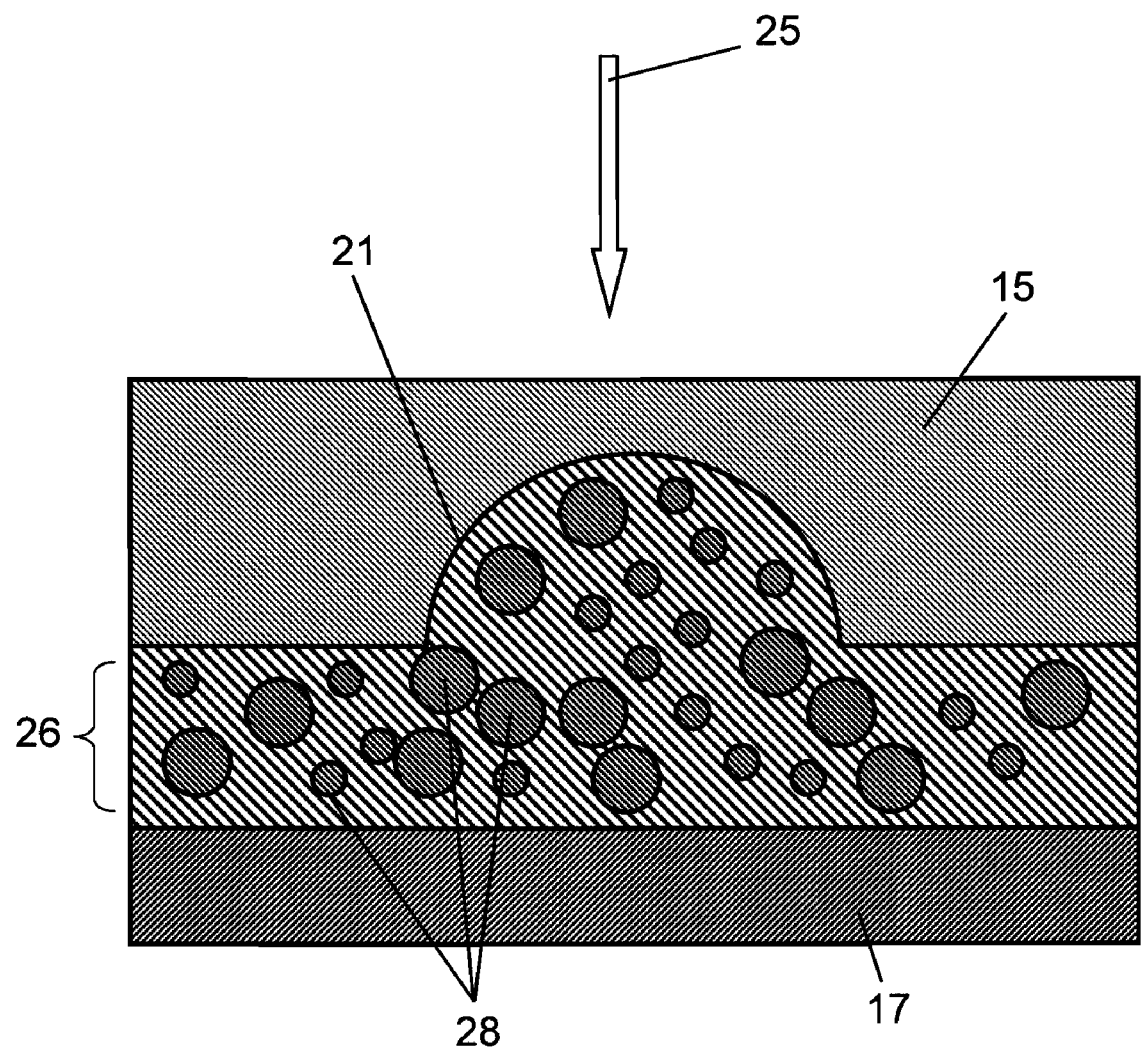
FIG. 13 is a schematic sectional view showing the condition of laminating and integrating a variety of members.

As indicated with arrow 25 of FIG. 12, these members are integrated and laminated by the use of a pressing device or a mold (neither is shown), so as to come into a state of FIG. 13.

FIG. 13 is a schematic sectional view showing the condition of laminating and integrating every sort of members. As shown in FIG. 13, heat dissipating plate 17 and metal wiring plate 15 having expanded groove 21 on part thereof are fixed through first filler-containing resin layer 26.

Next, a laser is applied in a direction indicated with arrow 25 of FIG. 13 so as to be superimposed on expanded groove 21 portion of metal wiring plate 15, to form a fine groove (not shown).

Figure 14:
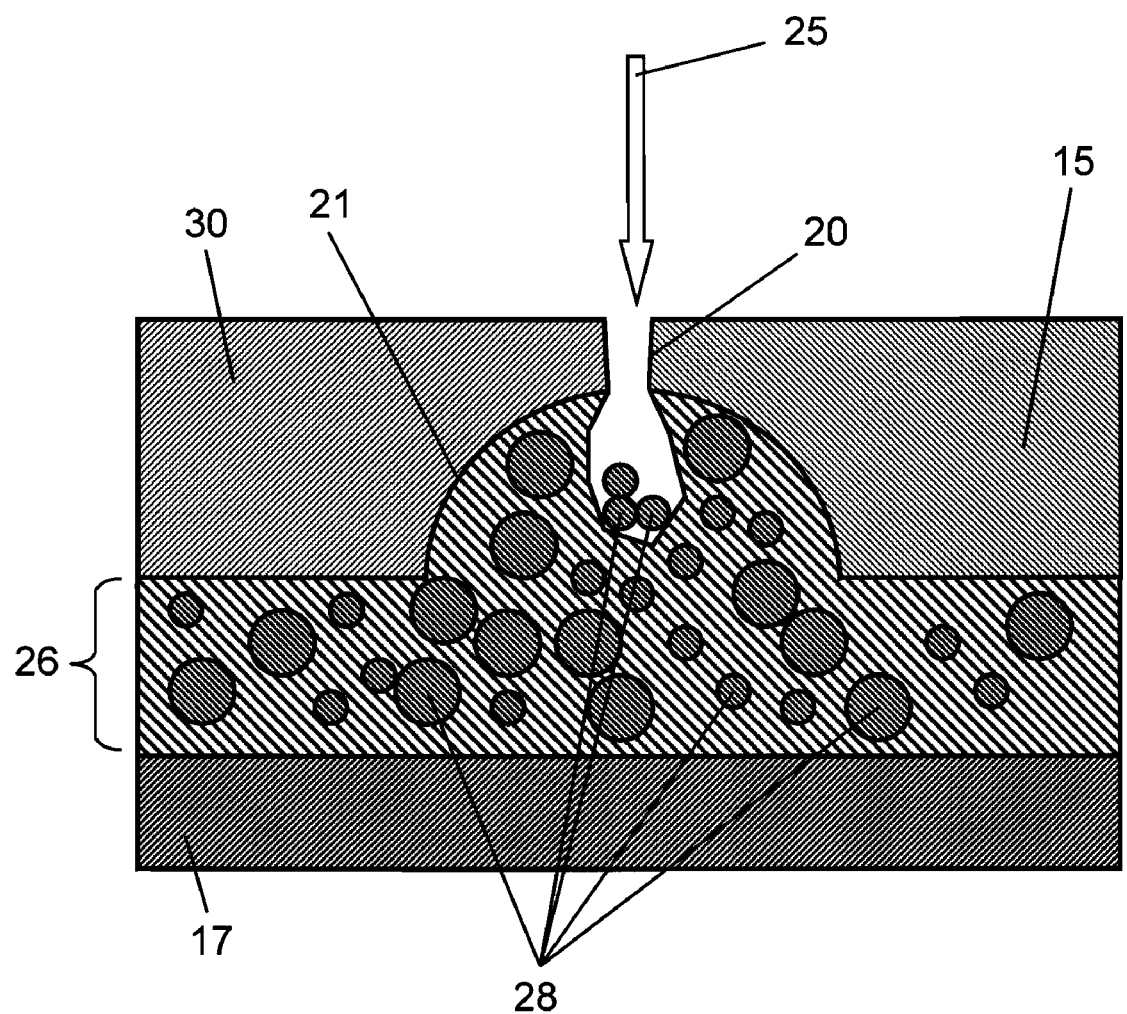
FIG. 14 is a schematic sectional view explaining the condition of forming the fine groove.

FIG. 14 is a schematic sectional view explaining the condition of forming fine groove 20. As indicated with arrow 25 of FIG. 14, expanded groove 21 portion of metal wiring plate 15 is irradiated with a laser, and part of metal wiring plate 15 is electrically or mechanically cut off as standalone wiring pattern 30. It should be noted that in this case, part of first filler-containing resin layer 26 immediately under fine groove 20 may be decomposed by the laser. Even if part of first filler-containing resin layer 26 is decomposed by the laser, first fillers 28 may not be decomposed and may be left. Alternatively, part of first fillers 28 may be partially sintered or aggregated. Increasing a content of first fillers 28 in first filler-containing resin layer 26 can reduce a size of a hole formed in first filler-containing resin layer 26. The content of first fillers 28 is desirably from 70 to 95 wt %. Next, the condition of filling this hole with second filler-containing resin 27 is described with reference to FIG. 15.

Figure 15:
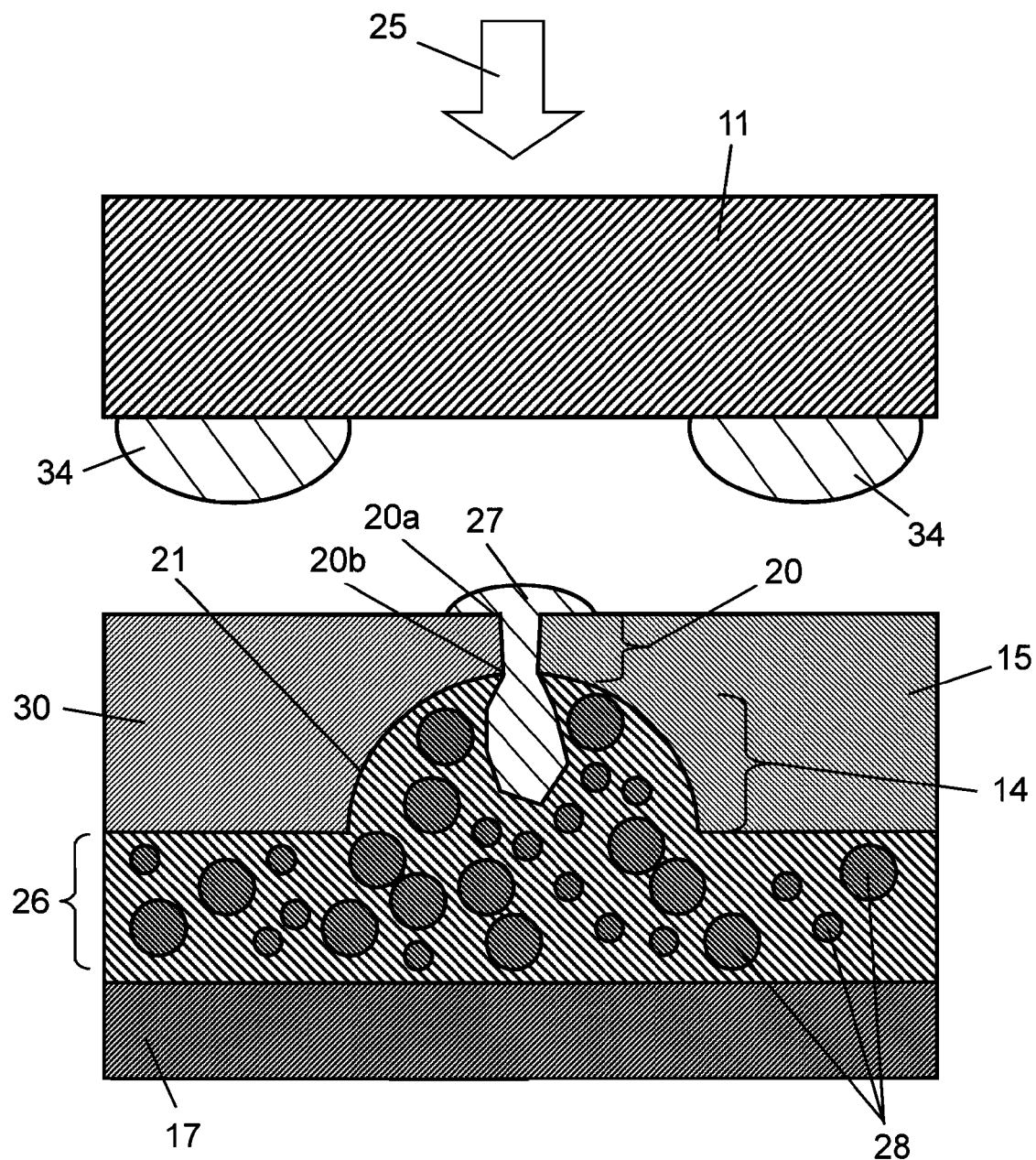
FIG. 15 is a schematic sectional view explaining the condition of filling a hole, generated at the time of forming the fine groove, with a second filler-containing resin.

FIG. 15 is a schematic sectional view explaining the condition of filling a hole, generated at the time of forming fine groove 20, with second filler-containing resin layer 27. In FIG. 15, bump 34 is formed of gold, solder or the like, and corresponds, for example, to a portion of a connection portion connecting LED 11 with metal wiring plate 15 or standalone wiring pattern 30, to an external electrode portion, or to some other portion.

In FIG. 15, second filler-containing resin layer 27 fills fine groove 20 and even the expanded groove 21 portion. It is to be noted that, while a residual generated at the time of processing fine groove 20, such as part of first filler-containing resin layer 26, can be removed by means of cleaning-removal, cleaning with compressed air, or the like, it may be left as it is and made part of second filler-containing resin layer 27. Alternatively, this residual may be made a filler component of second filler-containing resin layer 27. For example, it may be made second filler 29. (It is to be noted that second filler 29 is not shown in FIG. 15.)

As shown in FIG. 15, the inside of the hole formed in first filler-containing resin layer 26 is also filled with second filler-containing resin layer 27, thereby to exert the effect of expanding a bonding area with first filler-containing resin layer 26.

Further, fine groove 20 in FIG. 15 is formed from the front surface side of heat dissipating wiring board 10 as shown in FIG. 14, and hence the width of opening 20a is made larger than the width of lower end 20b. This can result in enhancement of the filling properties of second filler-containing resin layer 27.

It is to be noted that in FIG. 14, the laser is used for formation of fine groove 20, but etching or the like may be also used. In such a manner, the width of opening 20a is made larger than the width of lower end 20b so that lower end 20b of fine groove 20 can be cut into (or anchored to) first filler-containing resin layer 26 and second filler-containing resin layer 27. As a result of that, the effect of preventing peeling of metal wiring plate 15 in the vicinity of opening 20a, which has become thin, can be obtained. It is to be noted that as shown in FIG. 15, part of second filler-containing resin layer 27 is made to cover the top of metal wiring plate 15 in the vicinity of opening 20a, which has become thin, so that the effect of increasing an insulating distance (creeping distance) between metal wiring plate 15 and standalone wiring pattern 30 can be obtained.

Thereafter, as indicated with arrow 25 of FIG. 15, LED 11 is mounted on metal wiring plate 15 and standalone wiring pattern 30.

Embodiment 5

Next, Embodiment 5 is described with reference to FIGS. 16, 17 and 18 in terms of a method for forming standalone wiring pattern 30 on heat dissipating wiring board 10. It should be noted that the same places as those in the drawing used in descriptions in Embodiments 1 to 4 are provided with the same referential numerals.

Figure 16:
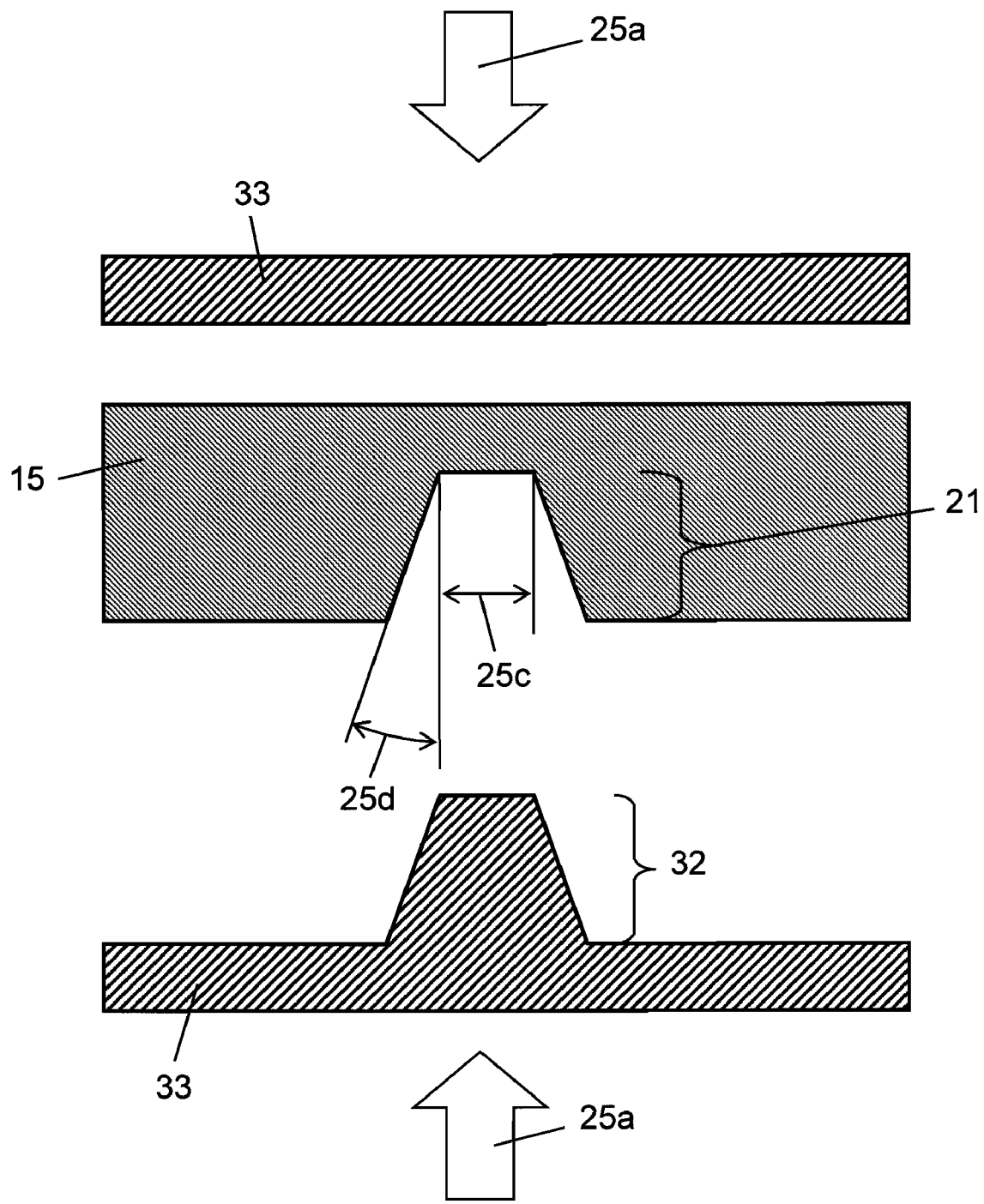
FIG. 16 is a schematic sectional view explaining the condition of forming the expanded groove in the metal wiring plate.
Figure 17:
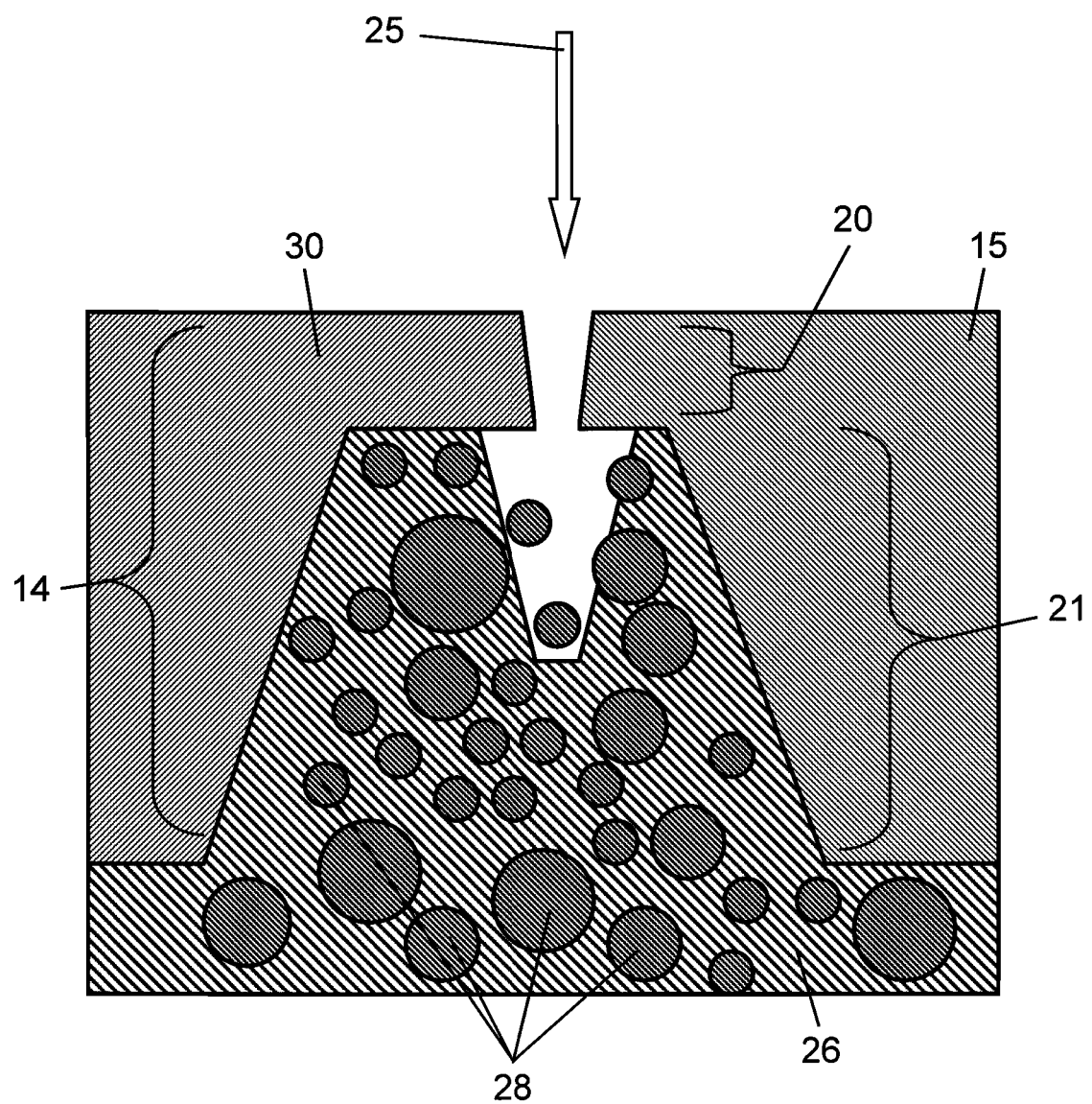
FIG. 17 is a schematic sectional view explaining the condition of forming the fine groove.

FIGS. 16 and 17 are schematic sectional views each explaining the condition of forming expanded groove 21 on metal wiring plate 15. As shown in FIG. 16, mold 33 having convex section 32 in part thereof is pressed onto both sides of metal wiring plate 15 in directions indicated with arrows 25a, to form expanded groove 21.

It is to be noted that an angle of the side surface of expanded groove 21 indicated with arrow 25d of FIG. 16 is desirably set to not smaller than 1 degree and not larger than 30 degrees, and more desirably to not smaller than 2 degrees and not larger than 10 degrees. When the degree is set to less than 1 degree, "removal" properties of mold 33 can be affected. Further, when the degree is set to larger than 30 degrees, pressing pressure needs to be increased.

It is to be noted that a groove width of expanded groove 21 at a ceiling section indicated with arrow 25c is desirably set to not smaller than 0.1 mm and not larger than 0.5 mm. Such a setting enables absorption of positional displacement at the time of forming fine groove 20 in this portion. Fine groove 20 is formed in this portion of the ceiling section. Fine groove 20 is not shown in FIG. 16.

Thereafter, as shown in FIG. 17, fine groove 20 is formed so as to be superimposed on part of expanded groove 21. FIG. 17 is a schematic sectional view explaining the condition of forming fine groove 20, and heat dissipating plate 17 and the like are not shown in FIG. 17. Arrow 25 in FIG. 17 indicates a direction in which fine groove 20 is formed by a laser or etching. With expanded groove 21 formed in trapezoidal shape, the thickness of metal wiring plate 15 in fine groove 20 portion can be substantially fixed even in the case of occurrence of positional displacement between the positions where expanded groove 21 and fine groove 20 are formed. This eliminates the need for fine adjustment of an etching condition (e.g. etching time), a laser condition, such as laser power, so that the effect of enhancing the productivity can be obtained.

Figure 18:
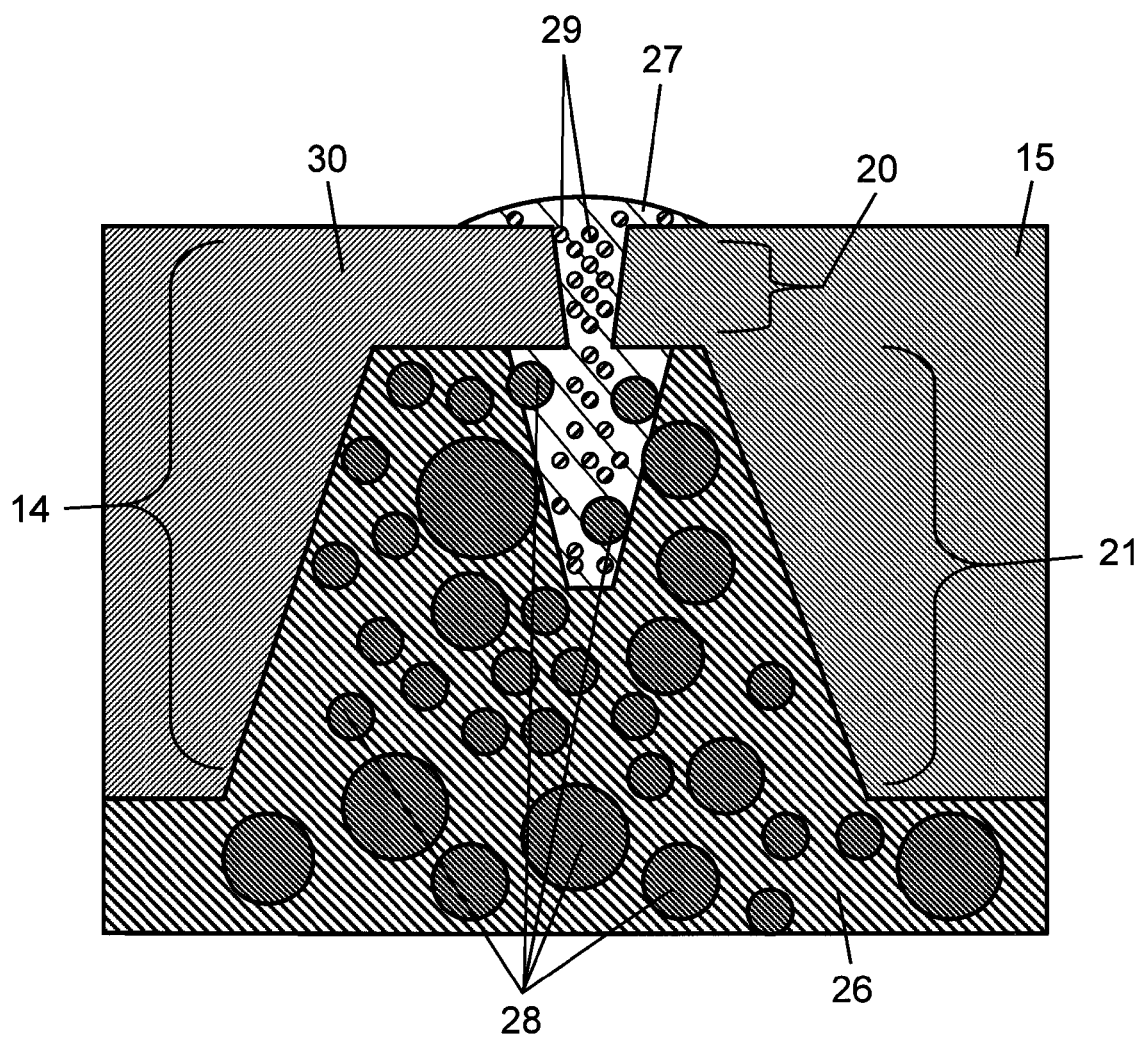
FIG. 18 is a sectional view explaining the condition of filling the fine groove with the second filler-containing resin layer.

FIG. 18 is a sectional view explaining the condition of filling fine groove 20 with second filler-containing resin layer 27. As shown in FIG. 18, the inside of fine groove 20 is filled with second filler-containing resin layer 27 containing second fillers 29 such that part of second filler-containing resin layer 27 is protruded on the front surface. With second filler-containing resin layer 27 protruded in this manner, the effect of increasing the insulating distance (creeping distance) between metal wiring plate 15 and standalone wiring pattern 30 can be obtained.

It is to be noted that second filler-containing resin layer 27 may, for example, be a solder resist. Forming the solder resist as second filler-containing resin layer 27 on the front surface of metal wiring plate 15 by printing or the like can prevent excessive expansion of the solder at the time of solder-mounting on metal wiring plate 15.

Dividing metal wiring plate 15 and standalone wiring pattern 30 by fine groove 20 and second filler-containing resin layer 27 can enhance degrees of freedom of the wiring pattern on heat dissipating wiring board 10.

It should be noted that patterns of expanded groove 21 and fine groove 20, such as the condition of heat dissipating wiring board 10 seen from the component-mounted surface, may have a straight-line shape, a curved shape, an L-shape, or a zigzag shape. This is because expanded groove 21 and fine groove 20 are formed by a laser, etching or the like, and such processing is suitable for a fine pattern, a complicated pattern, or a pattern of a small amount and a variety of kinds, for which punch processing performed by pressing with a mold is not suitable. As a result of that, the wiring pattern of metal wiring plate 15 in heat dissipating wiring board 10 can be provided with degrees of freedom of design as high as those of a typical print wiring plate using a glass epoxy resin.

It is to be noted that in FIG. 18, fine groove 20 is shown in the condition of being displaced from the center of expanded groove 21. This means that the configuration of FIG. 18 is capable of absorbing positional displacement between fine groove 20 and expanded groove 21.

Embodiment 6

In Embodiment 6, described is the case of expanded groove 21 and forming fine groove 20 by chemical etching. For example, a process of etching expanded groove 21 is as follows.

First, a resist mask provided with an etching hole in opening 20a of expanded groove 21 is formed on the under surface 15b side of metal wiring plate 15.

Next, this metal wiring plate 15 is impregnated with an aqueous solution made of ferric chloride or cupric chloride, and heated until desired expanded groove 21 is formed.

When the resist mask is then removed, metal wiring plate 15 having expanded groove 21 is formed. Since other configurations and manufacturing methods are the same as those in Embodiment 1 and the like, these configurations and methods are omitted.

In this manner, heat dissipating wiring board 10 proposed in Embodiments 1 to 6 can be made suitable for high-density mounting. Heat dissipating wiring board 10 can be used, for example, as a print wiring plate suitable for a bare chip, a substitute article for a heat dissipating wiring board, or an article suitable for high heat dissipation.

In a case where copper foil as wiring is required to be finely patterned having a thickness of not larger than 35 microns, the conventional print wiring plate is not suitable for a large current since its wiring has a thickness of not larger than 15 microns. Further, the heat generated in the bare chip is difficult to dissipate or spread through the copper foil.

However, as described in Embodiments 1 to 6, heat dissipating wiring board 10 can be produced by using, as metal wiring plate 15, a copper plate having a large thickness of, for example, not smaller than 100 microns, desirably not smaller than 200 microns, and further desirably not smaller than 300 microns in a case where high heat dissipation or reduction in wiring resistance is required.

For example, as shown in forgoing FIG. 18, facilitating formation of standalone wiring pattern 30 can expand an application area of heat dissipating wiring board 10. Namely, as a heat generating component to be mounted on heat dissipating wiring board 10, a power transistor, a power semiconductor, or a semiconductor such as a CPU can be mounted other then LED 11. Further, these semiconductors can be mounted in the form of a bare chip. For example, tens to hundreds of bumps can be mounted with high density at 50 to 100 micron pitches on metal wiring plate 15 having large thickness such as 100 to 500 microns.

Figure 19A:
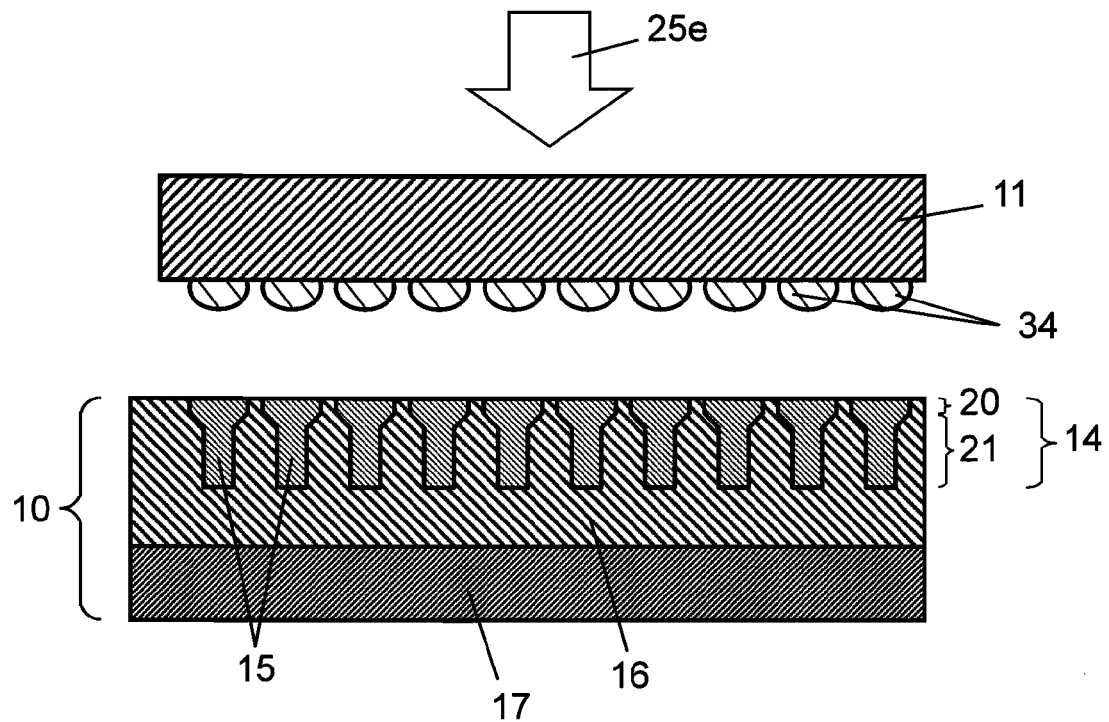
FIG. 19A is a sectional view showing an example of a heat dissipating wiring board suitable for high-density mounting.
Figure 19B:
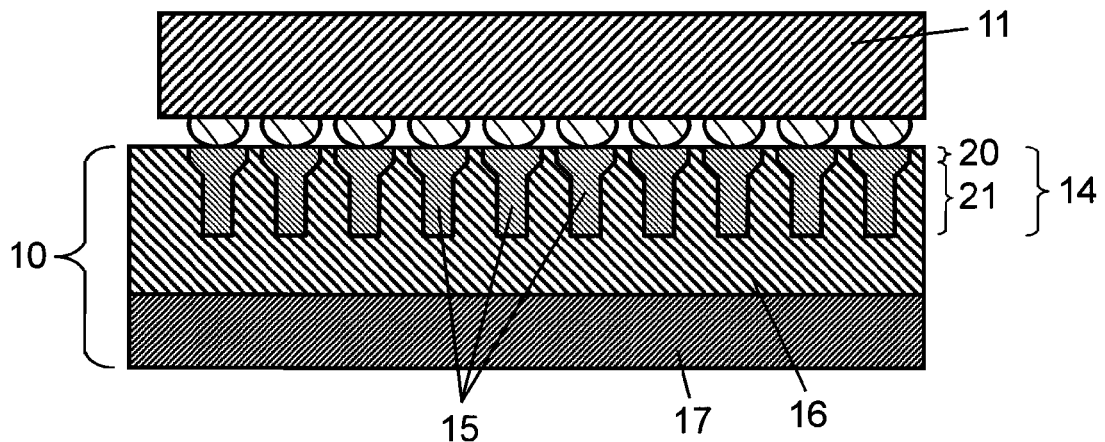
FIG. 19B is a sectional view showing an example of a heat dissipating wiring board suitable for high-density mounting.
Figure 20A:
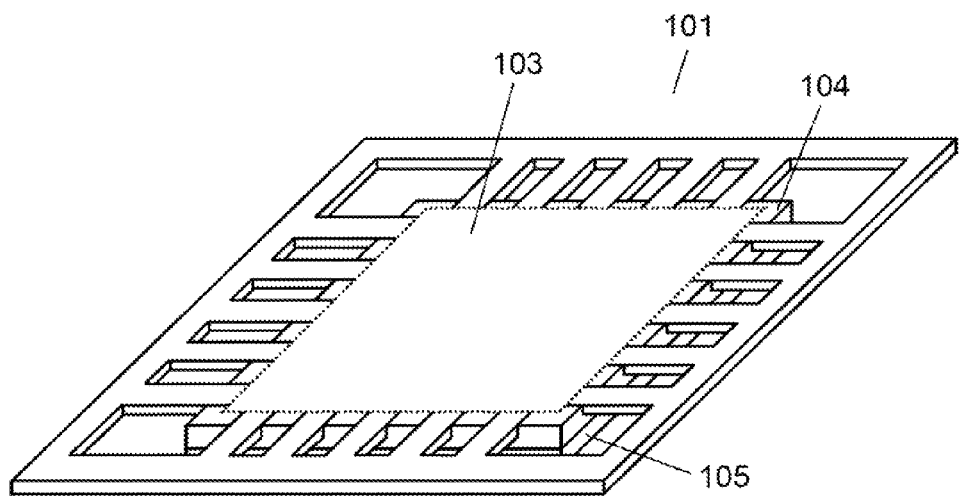
FIG. 20A is a perspective view of a conventional heat dissipating wiring board.
Figure 20B:
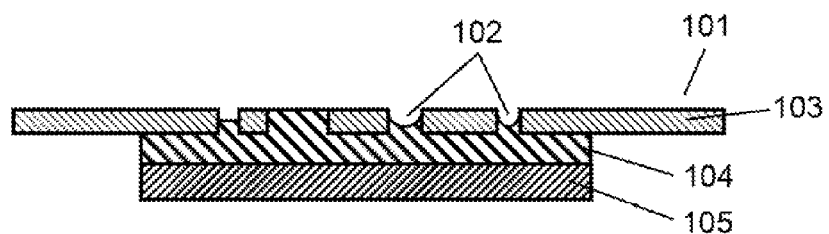
FIG. 20B is a sectional view of a conventional heat dissipating wiring board.
Figure 21:
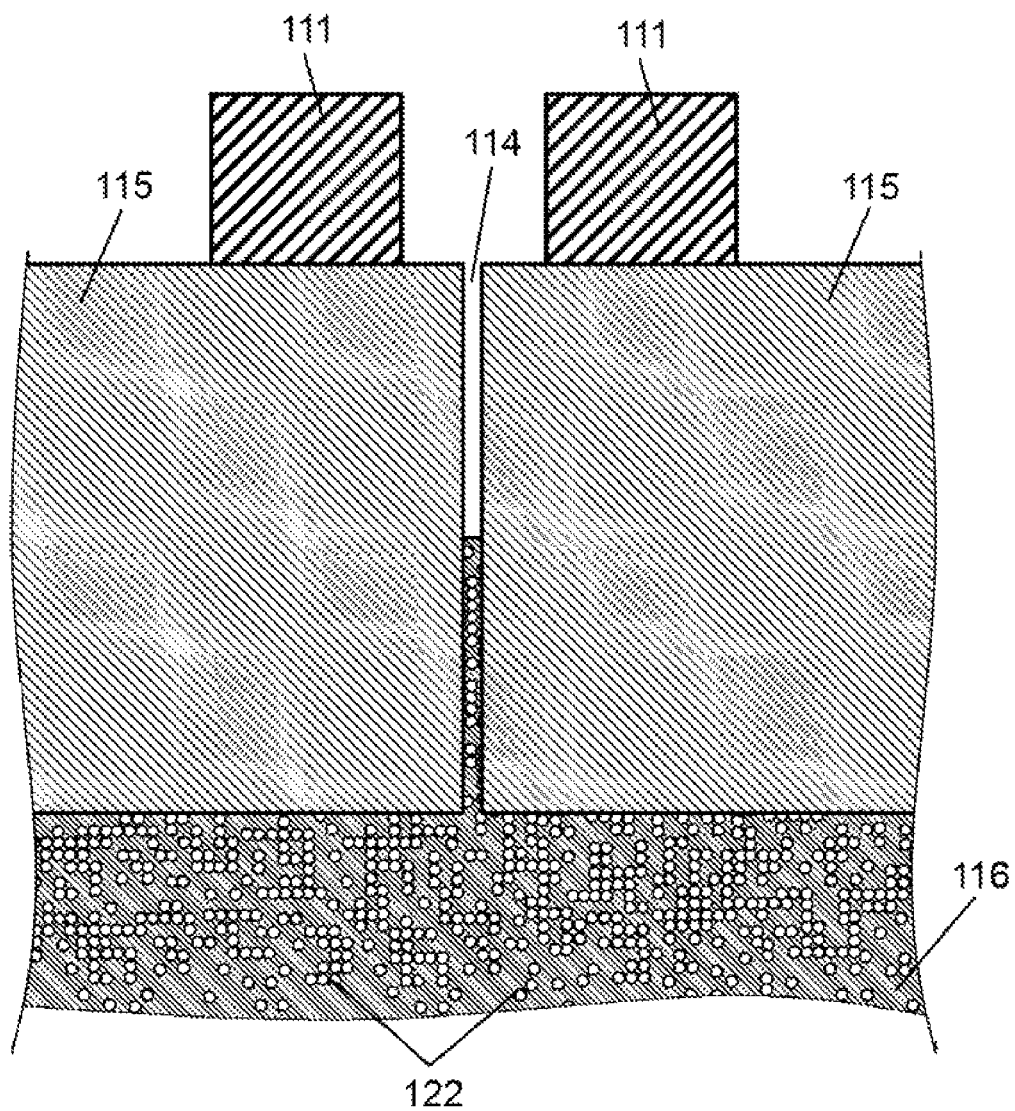
FIG. 21 is an expanded schematic sectional view of a conventional through groove.

FIGS. 19A and 19B are sectional views each showing an example of heat dissipating wiring board 10 suitable for high-density mounting. FIG. 19A corresponds to the cross section prior to the mounting, and FIG. 19B corresponds to the cross section after the mounting. It should be noted that the same places as those in the drawing used in descriptions in Embodiments 1 to 5 are provided with the same referential numerals.

In FIG. 19A, a plurality of metal wiring plates 15, such as lead frames, having large thickness, desirably a thickness of not smaller than 100 microns, are fixed with narrow pitches onto heat dissipating plate 17 in the state of being mutually insulated through filler-containing resin layer 16. Metal wiring plates 15 are mutually divided by through grooves 14 with at least fine grooves 20 and expanded grooves 21 formed on more than part thereof. Such a configuration enhances filling properties of filler-containing resin layer 16 into spaces of metal wiring plate 15, such as lead frames, having large thickness.

In FIG. 19A, used in place of LED 11 can be, for example, a power semiconductor, a CPU having a plurality of external connection terminals of bumps 34, or an electronic component accompanied by heat generation of a micro-transformer. It is to be noted that a method for mounting such an electronic component having a plurality of terminals and accompanied by heat generation in place of LED 11 is not necessarily restricted to bumps 34, but the method may be wire-connection using an aluminum wire, metal bonding, or the like. Further, it may also be gold-gold interconnection. Arrow 25e in FIG. 19 indicates a mounting direction.

FIG. 19B corresponds to the sectional view after the mounting. Forming standalone wiring pattern 30 with fine pitches in part of metal wiring plate 15 in such a manner allows high-density mounting of the CPU or the like. It is to be noted that standalone wiring pattern 30 is not necessarily formed on the front surface of metal wiring plate 15, but locally forming metal wiring plate 15 in a necessary portion can lead to a higher yield, thereby to realize heat dissipating wiring board 10 at low cost. Metal wiring plate 15 has a thickness of 300 microns, for example, and the foregoing fine pitches are (line width/space between lines)=(100 microns/50 microns), for example. The wiring pattern is a wiring pattern of an interposer or the like, for example. This can result in reduction in resistance of wiring which cannot be dealt with by a conventional print wiring board, a conventional interposer, or the like, or reduction in Joule heat generated due to expansion of a sectional area of a wiring portion. Accordingly, it is possible to realize reduction in size of power circuits (including a DC-DC converter and an AC-DC converter), a sustain circuit of a plasma television, and the like, and enhancement of performance by high-density mounting.

This can result in high-density mounting of a variety of semiconductors, such as a semiconductor laser and a power semiconductor, and power generating electronic components such as a micro-transformer on heat dissipating wiring board 10 suitable for the fine pattern described in Embodiment 5, and further for fine pitches, and hence power circuits of a PDP television, a liquid crystal television, and the like can be formed with a micro size. Moreover, the heat dissipating wiring board is suitable for high density and high heat dissipating of a projection-type television using a semiconductor light emitting element such as a laser light source, a light emitting module (a so-called engine portion) of a micro high-intensity projector, and a circuit on its periphery, thereby enabling realization of reduction in size of these electric devices.

As described above, the heat dissipating wiring board of the present invention shown in Embodiments 1 to 6 is capable of enhancing filling properties of filler-containing resin layer 16 and the like into through groove 14, and is capable of enhancing the reliability of heat dissipating wiring board 10.

Moreover, the following effect can be obtained by providing heat dissipating wiring board 10 where a difference in width between opening 20a and lower end 20b of fine groove 20 is not smaller than 5 microns, and desirably not smaller than 10 microns and not larger than 100 microns. Namely, at the time of filling fine groove 20 with filler-containing resin layer 16, the widths of opening 20a and lower end 20b are compared with each other and the groove having a larger width can be first filled with filler-containing resin layer 16, thereby allowing efficient filling of even a fine portion with filler-containing resin layer 16. Here, in the case of the width being smaller than 5 microns, a taper, or an inclination, of fine groove 20 decreases, and hence filling with filler-containing resin layer 16 may become difficult. In the case of the thickness being not smaller than 100 μm, processing of fine groove 20 becomes difficult.

Further, providing heat dissipating wiring board 10, where a difference in surface roughness between the inner wall of fine groove 20 and the inner wall of expanded groove 21 is not smaller than 0.01 micron in arithmetic mean roughness Ra, can enhance the adhesion strength with the filler-containing resin layer each in fine groove 20 or expanded groove 21. It is to be noted that the difference in surface roughness is desirably not smaller than 0.1 micron and not larger than 10 microns in arithmetic mean roughness Ra. When the difference is smaller than 0.1 microns, it may be included within the range of variations of the surface roughness, and when the difference exceeds 10 microns, fine-patternization of heat dissipating wiring board 10 may be difficult.

Moreover, providing heat dissipating wiring board 10, where oxidized film 24 having a thickness of not smaller than 0.01 micron is formed on either one of the inner walls of fine groove 20 and expanded groove 21 (or a difference in thickness of the oxidized film is not smaller than 0.01 micron and not larger than 10 microns), can improve the adhesion strength with filler-containing resin layer 16, and the like, depending upon the shapes of fine groove 20 and expanded groove 21, or the like. It is to be noted that in the case of the difference in thickness of the oxidized film being smaller than 0.01 micron, the difference may not be generated. In the case of the difference in thickness of the oxidized film exceeding 10 microns, the heat dissipation properties may be affected.

Furthermore, providing heat dissipating wiring board 10, where the groove width of fine groove 20 on the top surface 15a of metal wiring plate 15 is smaller than the groove width of expanded groove 21 on the under surface of metal wiring plate 15 by not smaller than 5 microns (desirably not smaller than 10 microns), can absorb positional displacement between fine groove 20 and expanded groove 21. This can lead to a higher processing yield. It is to be noted that in the case of the difference in groove width being smaller than 10 microns, processing is difficult, which may cause a cost increase. Further, the groove width itself is desirably not larger than 200 microns (more desirably, not larger than 100 microns). In the case of the groove width exceeding 200 microns, it may not be suitable for fine-patternization of heat dissipating wiring board 10.

Additionally, providing heat dissipating wiring board 10, where expanded groove 21 and fine groove 20 are both filled with the same filler-containing resin layer 16 or filler-containing resin layers 16 with not less than part of the respective compositions being different, can prevent dust or the like from being mixed into through groove 14 formed by laminating expanded groove 21 and fine groove 20, so that the reliability can be enhanced.

Providing heat dissipating wiring board 10, where the groove width of fine groove 20 on the top surface 15a of metal wiring plate 15 is smaller than the groove width of expanded groove 21 on the under surface of metal wiring plate 15 by not smaller than 5 microns (desirably not smaller than 10 microns), can absorb positional displacement between fine groove 20 and expanded groove 21, thereby leading to a higher processing yield. It is to be noted that in the case of the difference in groove width being smaller than 5 microns, processing is difficult, which may cause a cost increase. The groove width itself is desirably not larger than 200 microns (more desirably not larger than 100 microns). In the case of the groove width exceeding 200 microns, it may not be suitable for fine-patternization of heat dissipating wiring board 10.

It should be noted that heat dissipating wiring board 10 may be provided where second filler-containing resin layer 27 has a reflectivity of not less than 30% and not more than 99.5% in a visible light region of not smaller than 400 nm and not larger than 800 nm. In this manner, when a light emitting element such as LED 11 is mounted on the front surface of heat dissipating wiring board 10, the light reflectivity in second filler-containing resin layer 27 portion can be enhanced and the effect of improving the light emission efficiency can thus be obtained. A wavelength smaller than 400 nm or larger than 800 nm may not lead to higher efficiency. When the reflectivity is less than 30%, it may not lead to improvement in light emission efficiency. Further, when the reflectivity is made more than 99.5%, a high-priced member needs to be used, and using such a member may not be practical.

Providing heat dissipating wiring board 10, where second filler-containing resin layer 27 has a smaller content of fillers 22 than first filler-containing resin layer 26 (desirably smaller than first filler-containing resin layer 26 by not larger than 10 wt %), can enhance the filling properties of second filler-containing resin layer 27 into fine groove 20. With the difference in an added amount of fillers 22 being smaller than 10 wt %, the effect of separately using first filler-containing resin layer 26 and second filler-containing resin layer 27 may not be obtained, and in such a case, it may be advantageous in terms of cost to use the same resin layer for first filler-containing resin layer 26 and second filler-containing resin layer 27.

Further, providing heat dissipating wiring board 10, where first filler-containing resin layer 26 has a smaller elastic modulus than second filler-containing resin layer 27, can absorb the thermal expansion of metal wiring plate 15 due to a heat generating component such as LED 11 so that the effect of preventing peeling of the end of metal wiring plate 15 can be obtained. This is because first filler-containing resin layer 26 may be more affected by the heat than second filler-containing resin layer 27. It is to be noted that the elastic modulus is measurable by the use of micro-Vickers (e.g. JIS-Z2251), durometer (e.g. ISO-868), TMA (Thermal Mechanical Analysis), or the like. A difference in glass transition temperature (Tg) may be also used as the difference in elasticity modulus. In this case, Tg of second filler-containing resin layer 27 is made lower than Tg of first filler-containing resin layer 26 by not lower than 10° C. (desirably not lower than 20° C.). When the difference in Tg is lower than 10° C., stress by thermal expansion of metal wiring plate 15 may not be sufficiently alleviated. It should be noted that Tg of first filler-containing resin layer 26 is desirably not lower than 100° C., more desirably not lower than 130° C., and further desirably not lower than 150° C. When the difference in Tg is lower than 100° C., mechanical strength during operation and the like may be affected.

It is to be noted that the inside of expanded groove 21 may be actively filled not only with fillers 22 but also with ceramic sintered body or the like. In such a manner, the thermal conductivity in expanded groove 21 portion can be enhanced. Further, part of the fillers and the like are sintered (or aggregated) at the time of forming fine groove 20 by laser processing so as to be superimposed on expanded groove 21, so that the thermal conductivity can be enhanced. Alternatively, the inside of expanded groove 21 is previously added (or filled) with a member having durability to a laser, such as ceramic power or a ceramic sintered body, so that the effect of holding the effect of the laser irradiation upon filler-containing resin layer 16 low in, for example, laser processing on fine groove 20 in the case described in FIGS. 13 to 14, and the like.

Further, the method for manufacturing heat dissipating wiring board 10 is shown which includes steps of: forming expanded groove 21 on the under surface 15b of metal wiring plate 15; forming fine groove 20 from the top surface 15a side or the under surface 15b side of metal wiring plate 15 so as to superimpose part thereof on expanded groove 21, thereby to give through groove 14; and filling the groove with filler-containing resin layer 16 from the bottom of metal wiring plate 15. By this manufacturing method, heat dissipating wiring board 10 can be efficiently produced. It is to be noted that the operating order of these processes may be changed in accordance with capacities of facilities, or the like.

Moreover, the method for manufacturing heat dissipating wiring board 10 is shown which includes steps of: forming expanded groove 21 on the under surface 15b of metal wiring plate 15; filling the inside of expanded groove 21 with a resin containing first fillers 28 from the bottom of metal wiring plate 15; forming fine groove 20 on the top surface 15a of metal wiring plate 15 to electrically insulate part of metal wiring plate 15; and filling the inside of fine groove 20 with a resin containing second fillers 29. By this manufacturing method, as shown in FIG. 9, heat dissipating wiring board 10 having standalone wiring pattern 30 on part thereof can be stable manufactured.

As the first laser that forms expanded groove 21, a laser which performs oscillation at its pulse width from not smaller than 100 ns to continuous wave (CW) oscillation, a YAG laser or a $CO_2$ laser is used so that in the manufacturing process of heat dissipating wiring board 10, its lead time can be reduced and manufacturing in small amount or a large variety of kinds can be dealt with. As shown in FIG. 4, with the use of a low-priced or general-purpose laser, such as a laser using a typical Q switch, a laser with a long pulse width of not smaller than 100 ns, a CW laser (Continuous Wave Laser), or the like, expanded groove 21 can be formed at low cost. A laser having a short pulse width of smaller than 100 ns is high in price.

As the second laser that forms fine groove 20, a laser having a pulse width of not larger than 50 ns and/or a wavelength of not larger than 600 nm is used so that in the manufacturing process of heat dissipating wiring board 10, its lead time can be reduced and manufacturing in small amount or a large variety of kinds can be dealt with. With the pulse width set to not smaller than 1 ns and not larger than 50 ns, laser irradiation can be instantly completed, thereby suppressing the thermal damage from expanding to filler-containing resin layer 16 and the like. It is to be noted that, when the pulse width is set to not smaller than 50 ns, the thermal damage may expand to filler-containing resin layer 16 and the like. Further, setting the pulse width to smaller than 1 ns may be difficult in terms of technique and cost. Moreover, the use of a laser having a short wavelength of not larger than 600 nm enables fine processing on fine groove 20. Furthermore, application of such a short-wavelength laser in the state of having a short pulse width of not larger than 50 ns facilitates suppression of thermal effect from being exerted upon filler-containing resin layer 16 and the like.

As the manufacturing method in which expanded groove 21 is formed on the under surface 15b of metal wiring plate 15 by etching, part of expanded groove 21 is then irradiated with a laser to form fine groove 20, and thereafter, the grooves are filled with a resin containing fillers from the bottom of metal wiring plate 15, the combination of the etching, laser, and the like can stably provide the market with more various kinds of heat dissipating wiring boards 10.

INDUSTRIAL APPLICABILITY

The heat dissipating wiring board of the present invention is capable of filling a space between fine-pitched circuit patterns with a filler-containing resin, leaving no space, and is useful in improving the reliability against electric insulation due to dust and the like.

The invention claimed is:

1. A heat dissipating wiring board comprising:
a metal wiring plate with a circuit pattern formed therein;
a filler-containing resin layer having embedded therein said metal wiring plate such that a top surface of said metal wiring plate is exposed; and
a heat dissipating plate arranged on an under surface of said filler-containing resin layer, wherein
a space that divides part of said circuit pattern is formed of a through groove provided in said metal wiring plate,
said through groove comprises:
a fine groove that opens at said top surface of said metal wiring plate; and
an expanded groove that expands discontinuously from a lower end of said fine groove toward an under surface of said metal wiring plate,
said fine groove expands from said top surface of said metal wiring plate towards said expanded groove, and
an oxidized film formed on an inner wall of said fine groove is thicker than an oxidized film formed on an inner wall of said expanded groove.

2. The heat dissipating wiring board according to claim 1, wherein a difference between a width of an opening of said fine groove and a width of said lower end is not smaller than 5 microns and not larger than 100 microns.

3. The heat dissipating wiring board according to claim 1, wherein a difference between a surface roughness of an inner wall of said fine groove and a surface roughness of an inner wall of said expanded groove is not smaller than 0.1 micron and not larger than 10 microns in Ra.

4. The heat dissipating wiring board according to claim 1, wherein a difference between a thickness of the oxidized film formed on the inner wall of said fine groove and a thickness of the oxidized film formed on the inner wall of said expanded groove is not smaller than 0.01 micron and not larger than 10 microns.

5. The heat dissipating wiring board according to claim 1, wherein a maximum groove width of said fine groove is smaller than a maximum groove width of said expanded groove, and a difference between the maximum groove width of said fine groove and the maximum groove width of said expanded groove is not smaller than 50 microns and not larger than 500 microns.

6. A heat dissipating wiring board comprising:
a metal wiring plate with a circuit pattern formed therein;
a first filler-containing resin layer having embedded therein said metal wiring plate such that a top surface of said metal wiring plate is exposed; and
a heat dissipating plate arranged on an under surface of said first filler-containing resin layer, wherein
said circuit pattern is formed of a through groove provided in said metal wiring plate,
said through groove comprises:
a fine groove that opens at said top surface of said metal wiring plate; and
an expanded groove that expands from a lower end of said fine groove toward an under surface of said metal wiring plate, and
said fine groove is filled with a second filler-containing resin layer.

7. The heat dissipating wiring board according to claim 6, wherein a difference between a width of an opening of said fine groove and a width of said lower end is not smaller than 5 microns and not larger than 100 microns.

8. The heat dissipating wiring board according to claim 6, wherein a difference between a surface roughness of an inner wall of said fine groove and a surface roughness of an inner wall of said expanded groove is not smaller than 0.1 micron and not larger than 10 microns in Ra.

9. The heat dissipating wiring board according to claim 6, wherein a difference between a thickness of an oxidized film formed on an inner wall of said fine groove and a thickness of an oxidized film formed on an inner wall of said expanded groove is not smaller than 0.01 micron and not larger than 10 microns.

10. The heat dissipating wiring board according to claim 8, wherein said second filler-containing resin layer has a reflectivity of not less than 30% and not more than 99.5% in a visible light region of not smaller than 400 nm and not larger than 800 nm.

11. The heat dissipating wiring board according to claim 6, wherein said second filler-containing resin layer has a smaller content of fillers than said first filler-containing resin layer.

12. The heat dissipating wiring board according to claim 6, wherein an elastic modulus of said second filler-containing resin layer is smaller than an elastic modulus of said first filler-containing resin layer.

13. The heat dissipating wiring board according to claim 6, wherein a ceramic sintered body is provided inside said expanded groove.

* * * * *